US008129204B2

(12) United States Patent
Saito et al.

(10) Patent No.: US 8,129,204 B2
(45) Date of Patent: Mar. 6, 2012

(54) LIQUID DISCHARGE HEAD SUBSTRATE, LIQUID DISCHARGE HEAD USING THE SUBSTRATE, AND MANUFACTURING METHOD THEREFOR

(75) Inventors: Ichiro Saito, Yokohama (JP); Teruo Ozaki, Yokohama (JP); Takahiro Matsui, Yokohama (JP); Sakai Yokoyama, Kawasaki (JP); Takuya Hatsui, Tokyo (JP); Kazuaki Shibata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/841,410

(22) Filed: Jul. 22, 2010

(65) Prior Publication Data

US 2010/0285617 A1 Nov. 11, 2010

Related U.S. Application Data

(60) Division of application No. 11/774,248, filed on Jul. 6, 2007, now abandoned, which is a continuation of application No. PCT/JP2007/052166, filed on Feb. 1, 2007.

(30) Foreign Application Priority Data

| | | |
|---|---|---|
| Feb. 2, 2006 | (JP) | 2006-026019 |
| Mar. 10, 2006 | (JP) | 2006-065815 |
| Mar. 15, 2006 | (JP) | 2006-070818 |
| May 10, 2006 | (JP) | 2006-131415 |
| Dec. 1, 2006 | (JP) | 2006-325987 |

(51) Int. Cl.
*H01L 21/02* (2006.01)

(52) U.S. Cl. ........ 438/21
(58) Field of Classification Search ........ 347/63, 347/64
See application file for complete search history.

(56) References Cited

U.S. PATENT DOCUMENTS

| | | | | |
|---|---|---|---|---|
| 4,513,298 | A | 4/1985 | Scheu | |
| 4,686,544 | A | 8/1987 | Ikeda et al. | |
| 6,382,775 | B1 | 5/2002 | Kubota et al. | |
| 6,468,437 | B1 | 10/2002 | Kashino et al. | |
| 7,229,158 | B2 | 6/2007 | Park et al. | |
| 2005/0046677 | A1 | 3/2005 | Park et al. | |
| 2005/0196977 | A1 * | 9/2005 | Saito et al. | 438/791 |
| 2007/0285471 | A1 | 12/2007 | Park et al. | |

FOREIGN PATENT DOCUMENTS

| | | | |
|---|---|---|---|
| JP | 61158475 | A | 7/1986 |
| JP | 3-27027 | B2 | 4/1991 |
| JP | 8-58233 | A | 3/1996 |
| JP | 2003291353 | A | 10/2003 |
| JP | 2004-118973 | A | 4/2004 |
| JP | 2004-292877 | A | 10/2004 |
| KR | 10-2005-0021728 | | 3/2005 |
| WO | 2004/060680 | A1 | 7/2004 |

* cited by examiner

*Primary Examiner* — Matthew Luu
*Assistant Examiner* — Lisa M Solomon
(74) *Attorney, Agent, or Firm* — Fitzpatrick, Cella, Harper & Scinto

(57) ABSTRACT

Provided is a liquid discharge head substrate including: a substrate; a heating resistor layer formed on the substrate; a flow path for a liquid; a wiring layer stacked on the heating resistor layer and having an end portion which forms a step portion on the heating resistor layer; and a protective layer covering the heating resistor layer and the wiring layer including the step portion, and formed between the heating resistor layer and the flow path, in which the protective layer is formed by a Cat-CVD method.

4 Claims, 10 Drawing Sheets

LIQUID DISCHARGE HEAD SUBSTRATE, LIQUID DISCHARGE HEAD USING THE SUBSTRATE, AND MANUFACTURING METHOD THEREFOR

This application is a divisional of U.S. patent application Ser. No. 11/774,248, filed Jul. 6, 2007, which is incorporated by reference herein and which is a continuation of International Application No. PCT/JP2007/052166 filed on Feb. 1, 2007, which claims the benefit of Japanese Patent Application No. 2006-026019 filed on Feb. 2, 2006, Japanese Patent Application No. 2006-065815 filed on Mar. 10, 2006, Japanese Patent Application No. 2006-070818 filed on Mar. 15, 2006, Japanese Patent Application No. 2006-131415 filed on May 10, 2006 and Japanese Patent Application No. 2006-325987 filed on Dec. 1, 2006.

BACKGROUND OF THE INVENTION

1. Field of the Invention

The present invention relates to a liquid discharge head substrate for discharging a liquid, a liquid discharge head using the substrate, and a manufacturing method therefor.

2. Description of the Related Art

As a liquid discharge head for discharging a small amount of liquid, an ink jet head for discharging ink using heat energy is known. In recent years, there has been a demand for increasing speed of recording by an ink jet recording apparatus using the ink jet head. For this reason, a drive frequency for driving a heating resistor layer of the ink jet head has been increased, or the number of discharge ports has been increased. However, in order to provide a large number of discharge ports to a head substrate having a certain size, it is necessary to make a width of a wiring narrower, which results in increasing a wiring resistance. As a simple method of preventing the wiring resistance from increasing due to the narrowed wiring width, a height of the wiring is increased (thickness of wiring layer is increased).

Herein, a laminated structure in the vicinity of a heating portion is described with reference to FIG. 13 which is a schematic cross-sectional diagram of a conventionally known ink jet head for discharging ink using heat energy.

On an Si substrate 120, a heat accumulation layer 106 formed of an $SiO_2$ film which is formed by thermal oxidation or the like is formed. On the heat accumulation layer 106, a heating resistor layer 107 for applying heat energy to ink, and wirings 103 and 104 for applying a voltage to the heating resistor layer 107 are formed. A portion of the heating resistor layer 107 which is exposed from the wirings 103 and 104 becomes a heating portion 102. In addition, on the heating resistor layer 107 and the wirings 103 and 104, an insulating protective film 108 for protecting the heating resistor layer 107 and the wirings 103 and 104 is provided. Further, on the insulating protective film 108, a Ta film 110 serving as a cavitation resistant film is provided.

On the heating portion 102, an ink flow path (not shown) is formed. The heating portion 102 is in contact with the ink, with the result that the heating portion 102 may be chemically damaged due to corrosion or the like which is caused when the wirings 103 and 104 and the heating portion 102 that are made of metal are brought into contact with the ink, or may be physically damaged by foaming of ink. The insulating protective layer 108 for protecting the heating portion 102 and the wirings 103 and 104 from the damages and the Ta film 110 serving as an upper portion protective film 110 are formed. A portion of the Ta film 110, which is in contact with the ink and is provided on the heating portion 102, corresponds to a heat acting portion.

In the ink jet head substrate having the above-mentioned structure, in a case of forming a protective layer (protective film) for protecting the wirings stacked on the substrate from a liquid such as ink (preventing the wirings from being in contact with ink or the like), when a step of the wirings, that is, a height of the wirings, becomes smaller, more excellent step coverage of the protective layer is obtained.

Among the conventional methods of forming a protective layer (insulating protective layer), as a method capable of forming the protective layer by lowering the temperature (450° C. or lower), an atmospheric pressure CVD method, a plasma CVD method, and a sputtering method are known. However, the atmospheric pressure CVD method has a problem in that taper coverage is deteriorated while the substrate is less damaged. The plasma CVD method and the sputtering method each have a problem in that high energy is applied to particles and the particles are stacked on the substrate, which damages a substrate surface. An example of a method in which a damage to a substrate is relatively small includes a low pressure CVD method. However, the low pressure CVD method requires higher temperature of about 800° C., so it is difficult to deposit an insulating film after formation of the wirings made of metal materials.

Further, it is said that, in a case of forming a film, e.g., silicon oxide film by each of the methods, denseness thereof becomes smaller in the following order of the thermal oxidation method, the low pressure CVD method, the atmospheric pressure CVD method, and the plasma CVD method.

Conventionally, the protective layer of the above-mentioned ink jet head is formed by the plasma CVD method, but a layer quality (film quality) of the protective layer thus formed can be enhanced by setting film formation temperature higher. Specifically, when an alloy of aluminum, silicon, or the like, or silicide such as titanium silicide having heat resistance is used for wirings, the film formation temperature can be set higher.

However, the alloy of aluminum, silicon, or the like, or silicide such as titanium silicide has higher resistance than aluminum, which makes the height of the wirings higher and requires higher coverage of the protective layer. When aluminum or an aluminum alloy is exposed to the higher temperature, convex portions having sharp-pointed edges called "hillock" are formed to thereby lose evenness of the surface. In order to suppress formation of the hillock, it is necessary to further increase the layer thickness (film thickness) of the protective layer to be formed on the wirings made of aluminum or an aluminum alloy, contrary to the demand for making a layer thinner (making film thinner). In view of the above, it is difficult to enhance the film quality of the protective layer while increasing the film formation temperature.

Further, the protective layer formed by the plasma CVD method does not have a film quality with a required denseness, which raises the following problems.

1. While the protective layer has a certain protective function with respect to ink, the film may be eluted with respect to an ink of some kind.

2. A step portion does not constantly have sufficient coverage, so ink enters from a portion having insufficient coverage, which may lead to breaking of wirings.

3. The protective layer is scraped off during a process of repeating foaming and defoaming of ink due to insufficient cavitation resistance. Accordingly, the protective layer made of metal such as Ta having higher cavitation resistance is required.

SUMMARY OF THE INVENTION

It is an object of the present invention to provide a protective layer used for a liquid discharge head, which is dense and chemically and physically stable, has an insulation property and resistance to a liquid such as ink even when the protective layer is made into a thin film, has excellent step coverage, and is desirably made further thinner.

Another object of the present invention is to provide a liquid discharge head substrate including: a substrate; a heating resistor layer formed on the substrate; a flow path for a liquid; a wiring layer stacked on the heating resistor layer and having an end portion which forms a step portion on the heating resistor layer; and a protective layer covering the heating resistor layer and the wiring layer including the step portion, and formed between the heating resistor layer and the flow path, in which the protective layer is formed by a Cat-CVD method.

Further another object of the present invention is to provide a method of manufacturing a liquid discharge head substrate, the liquid discharge head substrate including: a substrate; a heating resistor layer formed on the substrate; a flow path for a liquid; a wiring layer stacked on the heating resistor layer and having an end portion which forms a step portion on the hating resistor layer; and a protective layer covering the heating resistor layer and the wiring layer including the step portion, and formed between the heating resistor layer and the flow path, the method comprising forming the protective layer by supplying at least a gas containing silicon and a gas containing nitrogen at a substrate temperature of 50° C. to 400° C. by the Cat-CVD method.

Further features of the present invention will become apparent from the following description of exemplary embodiments with reference to the attached drawings.

BRIEF DESCRIPTION OF THE DRAWINGS

Figure 1:
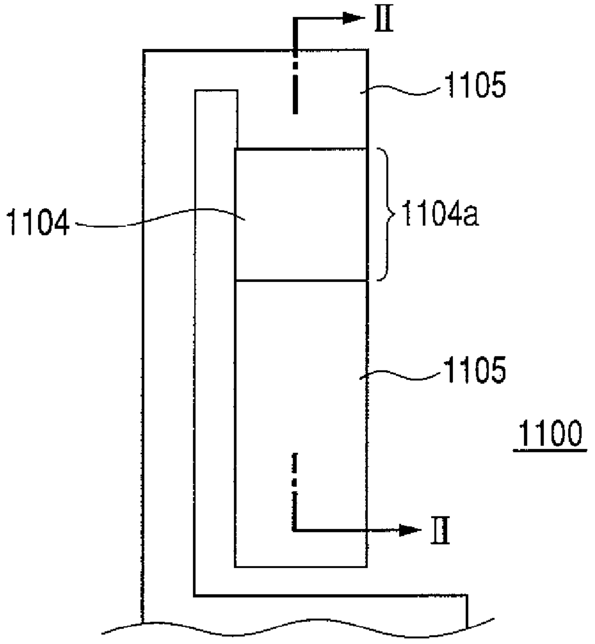
FIG. 1 is a schematic plan view of an ink jet head substrate in the vicinity of a heat acting portion thereof according to an example of the present invention.

In the following examples, description will be made of a liquid discharge head including: a substrate; a heating resistor layer formed on the substrate; a flow path for a liquid; a wiring layer stacked on the heating resistor layer and having an end portion which forms a step portion on the heating resistor layer; and a protective layer covering the step portion, and formed between the heating resistor layer and the flow path. Further, as an example of a protective layer (insulating protective layer) of a metal wiring portion of a liquid discharge head substrate, description will be made of an ink jet head substrate serving as a liquid discharge head substrate in which a protective layer that is dense, has high coverage, and can be desirably made into a thin film, is formed. In addition, description will be made of an ink jet head serving as a liquid discharge head using the ink jet head substrate, and an ink jet recording apparatus serving as a liquid discharge apparatus using the head. The excellent protective layer can be obtained by a catalytic chemical vapor film formation method (hereinafter, referred to as "Cat-CVD method").

The Cat-CVD method is a method in which a source gas is subjected to catalytic cracking by a heating medium which is heated to high temperature (1600° C. to 1800° C.) and is stacked on a substrate to thereby form a thin film. A film obtained by the Cat-CVD method has high coverage, and causes little damage to the substrate at the time of film formation. Further, in a case of an oxide film formed at a substrate temperature of 50° C. to 400° C., desirably about 100° C. to 300° C., it is possible to obtain a thin film which is dense and has little defect like a thin film obtained by a thermal oxidation method. As a matter of course, in a case of forming films other than the oxide film, it is possible to form a thin film which is dense and has little defect.

Further, a dense film can be obtained even when the substrate temperature is lowered at the time of film formation, so it is possible to reduce a film stress by lowering the substrate temperature, and to maintain a protective function thereof even when the film is thinned. By making the protective layer into a thin film, it is possible to suppress transfer loss of heat energy from a heating resistor layer covered with the protective layer to a liquid (ink).

(Cat-CVD Apparatus and Film Formation Method for CVD Film Using the Apparatus)

Description will be made of a Cat-CVD apparatus and a film formation method with reference to a schematic diagram of a Cat-CVD apparatus shown in FIG. 6. The Cat-CVD apparatus includes, in a deposition chamber 301, a substrate holder 302, a heater 304 serving as a catalytic member for subjecting a gas to catalyzed degradation, and a gas introducing portion 303 formed so as to be in contact with the heater 304, for introducing a source gas. In addition, the Cat-CVD apparatus includes an exhaust pump 305 for reducing the pressure of the deposition chamber 301. Further, a heater for heating the substrate may be provided to the substrate holder 302.

The Cat-CVD method is a method including heating the heater 304 serving as a catalytic member, subjecting a source gas to catalytic reaction by the heater portion 304 to be dissolved, and stacking the source gas on a surface of the substrate placed on the substrate holder 302, to thereby form a film. The Cat-CVD method is a film formation method capable of forming a film by lowering the substrate temperature.

In a case of forming an SiN film, monosilane ($SiH_4$), disilane ($Si_2H_6$), or the like may be used as a silicon source gas, and ammonia ($NH_3$) may be used as a nitrogen source gas. As a catalytic member, tungsten (W) may be used. In addition, hydrogen ($H_2$) may be added for improving the coverage.

Further, dimethylsilane (DMS), tetraethoxysilane (TEOS), dimethyldimethoxysilane (DMDMOS), or the like may be used as a source gas to produce an SiOC film. In this case, oxygen ($O_2$) may be added.

In addition, by using hexamethyldisilazane (HMDS) as a source gas and adding an ammonia ($NH_3$) gas, it is possible to produce an SiCN film.

By performing the film formation using not only the above-mentioned raw materials but also a source gas containing Si, N, C, and O or a source gas compound, it is possible to form a desired thin film.

Hereinafter, embodiments of the present invention will be described. Note that the present invention is not limited only to the embodiments described below, but any structure may be appropriately adopted within a scope of claims as long as the objects of the present invention can be attained. In particular, in first to fifth embodiments described below, a structure capable of producing a liquid discharge head substrate and a liquid discharge head by combination of the embodiments thereof is within a range where the present invention can be applied.

First Embodiment

According to an embodiment of the present invention, a thin film formed using a catalytic chemical vapor deposition method (Cat-CVD method) is used as an insulating protective layer of a heating portion of an ink jet head substrate. The Cat-CVD method enables formation of a thin film which is dense and has little defect at low temperature as compared with a conventional method such as the low pressure, atmospheric pressure, or plasma CVD method, and the sputtering method. In other words, it is possible to form a dense and less defective film at lower substrate temperature (50° C. to 400° C.) as compared with the sputtering method using high energy particles or the CVD method using plasma that have been conventionally used.

Further, it is possible to reduce a film stress by lowering the substrate temperature at the time of film formation, and to obtain a dense film. For this reason, it is possible to maintain an excellent protective function as a protective layer even when the film is thinned. By thinning the protective film covering the heating resistor layer, it is possible to suppress the heat transfer loss from the heating resistor layer to ink, so the heat energy can be effectively used.

In addition, in a case of using aluminum or an aluminum-based alloy (e.g., Al—Si) for a wiring, when the CVD method using plasma is employed, the film is damaged not only by the higher substrate temperature at the time of film formation but also by plasma, with the result that surface roughness having sharp-pointed edges called "hillock" occurs. In contrast, in the Cat-CVD method, catalyzed degradation of a source gas and a heat catalyst is utilized, so the surface of the wiring is not damaged by plasma. As a result, the surface roughness due to decomposition does not occur on the surface of the wiring. For this reason, there is no necessity to form a thick insulating film on the surface of the aluminum-based wiring.

The ink jet head substrate according to this embodiment, the protective layer is formed by the Cat-CVD method. Accordingly, it is possible to form a protective layer having an excellent resistance to ink even when a protective layer having a layer thickness (film thickness) smaller than that of the conventional case is used, and having high coverage in the step portion.

Further, the protective layer obtained by the Cat-CVD method is a film having a density larger than that of the conventional protective layer, and having a cavitation resistance, so it is possible that an upper portion protective layer formed of a metal film such as tantalum (Ta) is not formed.

In addition, the layer thickness (film thickness) of the protective layer of the heating portion can be reduced, and desirable heat conductivity from the heating portion to the liquid ink is obtained. Accordingly, an amount of heat escaped from the heating portion to the substrate side is reduced, and the problem of heat accumulation or temperature rise of the ink jet head itself can be suppressed.

Unlike the film formation method using high energy particles, in the Cat-CVD method, a thin film is formed by utilizing catalyzed degradation, which makes it easier to control the film stress. This is convenient in terms of production of an ink jet head, in a case where head compositions such as an ink flow path and the like made of an organic resin or the like are formed on an upper part of the protective layer, the thin film can be formed by particularly taking a stress balance between the organic resin or the like and the protective layer into consideration.

The ink jet head is required to have more nozzles (increase of the number of ink discharge ports) in order to correspond to increase in speed and higher resolution of an ink jet printer (one mode of the ink jet recording apparatus) of the future. With the requirement, a nozzle row length is increased, with the result that the ink jet head substrate tends to increase in length.

A semiconductor integrated circuit (LSI) chip has a rectangular shape close to a square, so the LSI chip is less deformed by a stress of the protective layer. However, a chip (ink jet head substrate) for an ink jet printer has a shape having a side extremely longer than the other side for the above-mentioned reason. Accordingly, it is important to reduce a film stress (internal stress) of the protective layer which causes deformation or breakdown of a chip.

The ink jet head uses multiple colors of ink for improving color reproducibility. As a result, alkalescent ink, neutral ink, or acidulous ink is used. Those inks are not only constantly in contact with the film but also directly in contact with the ink which is heated at the time of ink discharge, which imposes various restrictions on the protective layer used for the ink jet head.

The protective layer used for the ink jet head is required not only to have resistance to ink but also to effectively transfer the heat from a heating member (heating resistor layer) to ink. As a result, the protective layer used for the ink jet head has a larger restriction than a general protective layer of a device in the semiconductor filed, which requires design of a film in terms of the resistance to ink and the energy transfer efficiency. It was found that the protective layer formed by using the Cat-CVD method can satisfy the demand.

Example 1-1

Hereinafter, Example 1-1 will be described in detail with reference to the drawings.

Figure 2:
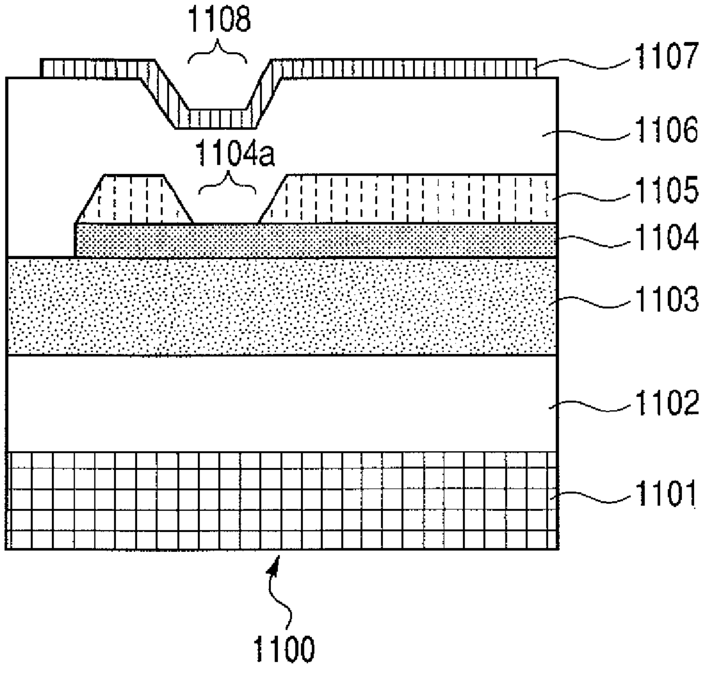
FIG. 2 is a cross-sectional diagram taken along the line II-II of FIG. 1.

FIG. 1 is a schematic plan view of an ink jet head substrate 1100 in the vicinity of a heat acting portion thereof according to Example 1-1, and FIG. 2 is a cross-sectional diagram taken along the line II-II of FIG. 1. Herein, parts corresponding to portions having similar functions in each part of FIGS. 1 and 2 are denoted by the same reference symbols.

As shown in FIG. 1, a part of a wiring layer of an electrode wiring layer 1105 formed on an ink jet head substrate 1100 is removed, and a heating resistor layer 1104 formed under the electrode wiring layer 1105 is exposed.

As shown in FIG. 2, a heat accumulation layer 1102 and an interlayer film 1103 are formed in the stated order on the ink jet head substrate 1100 formed of a silicon substrate 1101, and the heat resistor layer 1104 and the electrode wiring layer 1105 are formed in the stated order on the interlayer film 1103. A portion, which is formed such that a part of the electrode wiring layer 1105 is removed and the heating resistor layer 1104 is exposed, becomes a heating portion 1104*a*. The heating resistor layer 1104 and the electrode wiring layer 1105 each have a wiring pattern as shown in FIG. 1. Further, an insulating protective layer 1106 and an upper portion protective layer 1107 are formed in the stated order on the electrode wiring layer 1105. In this case, a surface of the upper portion protective layer 1107, which corresponds to the heating portion 1104*a*, becomes a heat acting portion 1108.

Next, a method of manufacturing the above-mentioned ink jet head substrate 1100 will be described. First, a silicon substrate 1101 having a plane crystal orientation of <100> was prepared. A silicon substrate into which a drive circuit is incorporated in advance may be used as the silicon substrate 1101. Then, an SiO film serving as the heat accumulation layer 1102 with a layer thickness (film thickness) of 1.8 μm was formed on the silicon substrate 1101 by the thermal oxidation method. Further, an SiO film serving as the interlayer film 1103 which also functions as a heat accumulation layer was formed with a film thickness of 1.2 μm by the plasma CVD method. In a case of using the silicon substrate into which a drive circuit is incorporated, a thermal oxide film obtained at the time of formation of a local oxide film for separating semiconductor devices constituting the drive circuit is used. After the formation of the semiconductor devices, the SiO film can be formed by the plasma CVD method.

Then, a TaSiN film serving as the heating resistor layer 1104 and an aluminum layer serving as the electrode wiring layer 1105 were formed by using the sputtering method. With regard to the TaSiN film, the TaSiN film serving as the heating resistor layer 1104 was formed by a reactive sputtering method using Ta—Si as an alloy target.

Then, dry etching was performed by using a photolithography method, and the heating resistor layer 1104 and the electrode wiring layer 1105 were patterned at the same time. Subsequently, dry etching was performed by using the photolithography method, and a part of the electrode wiring layer 1105 was etched to be removed, thereby forming a heating portion 1104*a* which has a size of 20 μm×20 μm and functions as a heater. Note that an end portion of the patterned electrode wiring layer 1105 desirably has a tapered shape to enhance the coverage of the protective layer formed so as to cover the end portion in the subsequent process. The dry etching for the aluminum constituting the electrode wiring layer 1105 is desirably performed under conditions of isotropic etching, but wet etching can also be employed.

Subsequently, an SiN film serving as the insulating protective layer 1106 with a film thickness of 250 nm was formed by using the Cat-CVD method.

Finally, a tantalum film serving as the upper portion protective layer 1107 with a thickness of 200 nm was formed by the sputtering method, and patterning was performed to thereby obtain the ink jet head substrate 1100 shown in FIG. 2.

Here, film formation by the Cat-CVD method will be described with reference to FIG. 6.

The chamber 301 was reduced in pressure by exhausting air until a pressure inside thereof becomes $1\times10^{-5}$ Pa to $1\times10^{-6}$ Pa using the exhaust pump 305. Then, an $NH_3$ gas of 200 sccm was introduced into the deposition chamber 301 from a gas inlet 303. At this time, a heater (not shown) for heating the substrate was adjusted to obtain the substrate temperature of 300° C. In addition, an external power source was adjusted to heat up the heater 304 serving as a heating catalytic member to the temperature of 1700° C.

Then, an $SiH_4$ gas of 5 sccm was introduced into the chamber 301, and an SiN film was formed on the surface of the silicon substrate 1101 placed on the substrate holder 302 by catalyzed degradation of the $NH_3$ gas and the $SiH_4$ gas. Note that the pressure (deposition pressure) inside the deposition chamber 301 in a case where film formation was being performed by introducing a gas was 5 Pa.

The formed SiN film had a film thickness of 250 nm and a film stress of 200 MPa (tensile stress).

By changing a composition of a gas to be introduced, in a continuous fashion or stepwise, an insulating protective layer such as an SiN film whose composition has been changed in a film thickness direction can also be formed. For example, by changing flow rates of the $NH_3$ gas and the $SiH_4$ gas, an insulating protective layer in which the composition of the SiN film has been changed in a film thickness (layer thickness) direction can be formed.

Further, by adding a small amount of oxygen as a source gas, as well as the $NH_3$ gas and the $SiH_4$ gas, an SiON film can be produced.

It should be noted that the upper portion protective layer 1107 formed of a tantalum film with a film thickness of 200 nm formed as a protective layer has higher heat conductivity than the insulating protective layer 1106, which does not lower thermal efficiency to a large extent. The upper portion protective layer 1107 is formed directly on the dense insulating protective layer 1106, so the upper portion protective layer 1107 can transfer the heat energy from the heating portion 1104*a* to the heat acting portion 1108 with efficiency, which can be effectively used for the discharge of ink.

Subsequently, the ink jet head substrate 1100 constituted by using the above-mentioned silicon substrate 1101 will be described with reference to a schematic perspective view of an ink jet head shown in FIG. 4.

On the surface of the silicon substrate 1101, the respective layers are stacked such that an elongated ink supply port 9 for supplying ink to be discharged, and the heat acting portions 1108 are arranged in a row on both sides of the ink supply port 9, as shown in FIG. 2. On the surface of the silicon substrate 1101, a flow path forming member 4 having ink discharge ports 5 and a flow path (not shown) which communicates with the discharge port 5 and the supply port 9 that are formed therein is formed, thereby constituting the ink jet head substrate 1100.

Figure 4:
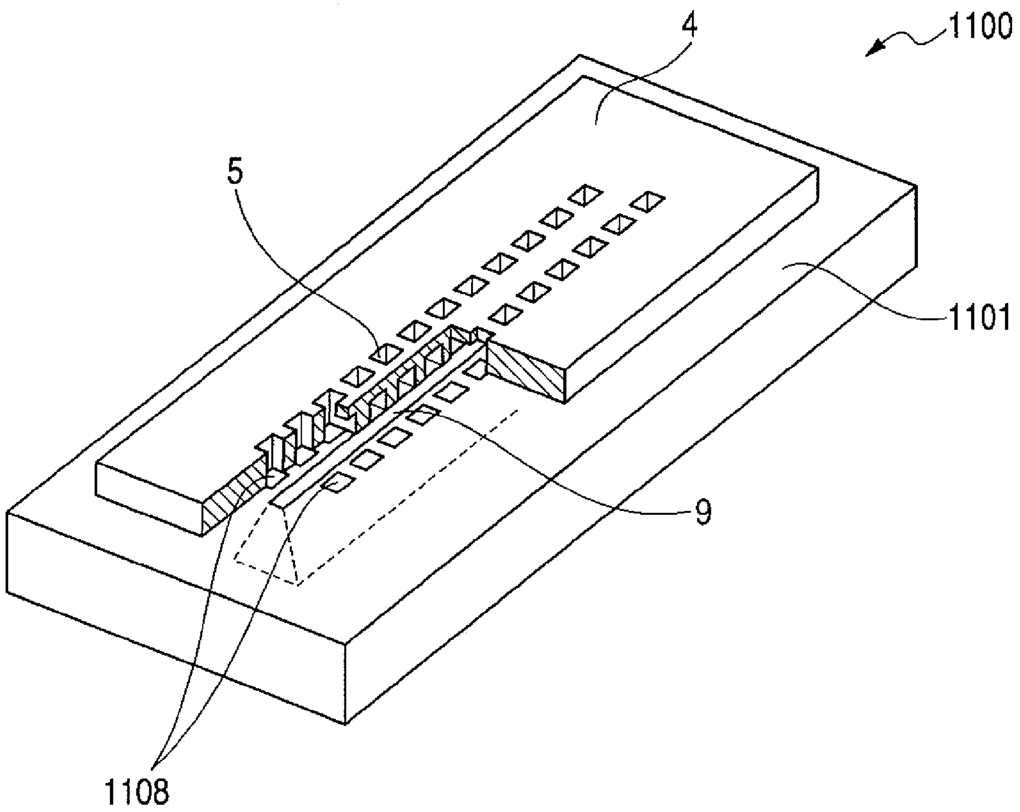
FIG. 4 is a schematic plan view of the ink jet head substrate in the vicinity of the heat acting portion thereof according to the example of the present invention.

FIGS. 5A to 5D are schematic cross-sectional diagrams for illustrating processes of manufacturing the ink jet head shown in FIG. 4.

On an $SiO_x$ film 1007 formed on a back surface of the silicon substrate 1101 on which the heating portion 1104*a* was formed, there was formed a patterning mask 1008 having alkali resistance, for forming the ink supply port 9.

Figure 5A:
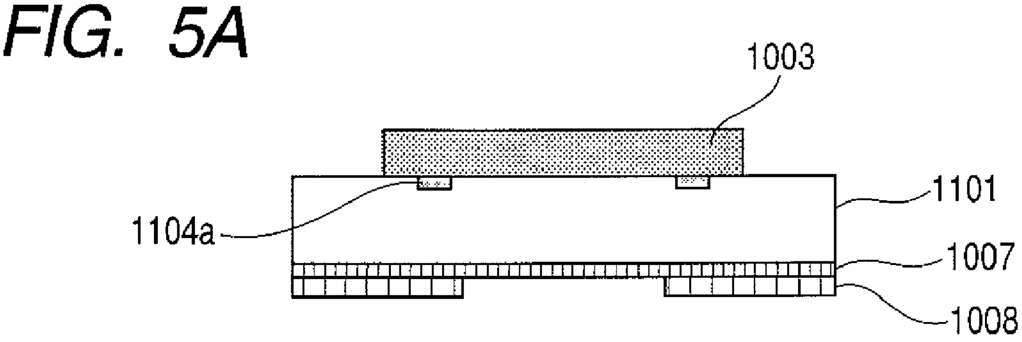
FIGS. 5A, 5B, 5C and 5D are schematic cross-sectional diagrams for illustrating a method of manufacturing the ink jet head shown in FIG. 4.

Next, onto the surface of the silicon substrate having a laminated structure as shown in FIG. 2, a positive-type photoresist was applied with a predetermined thickness by spin-coating. Then, the positive-type photoresist was patterned by using a photolithographic technique to thereby form a mold material 1103 (FIG. 5A).

Then, a raw material of the flow path forming member 4 was applied by spin-coating so as to cover the mold material 1003, and thereafter, patterning was performed with a desired shape by the photolithographic technique. Then, at a position opposing the heat acting portion 1108, the ink discharge ports 5 were opened by the photolithographic technique.

Figure 5B:
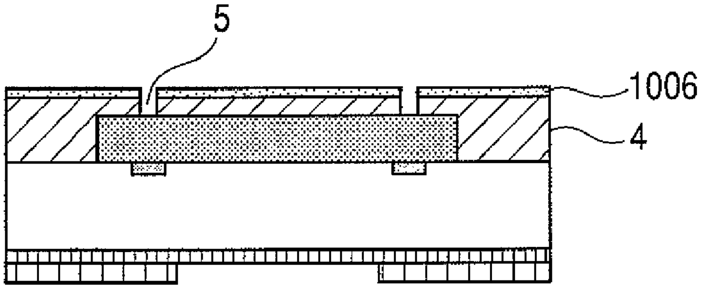

After that, on a surface of the flow path forming member 4 in which the ink discharge port 5 were opened, a water repellent layer 1006 was formed by laminating a dry film or the like (FIG. 5B).

The flow path forming member 4 constitutes a flow path wall of the ink flow path, and is constantly in contact with the ink during a time when the ink jet head is used. Accordingly, a photoreactive cationic polymerized compound is particularly suitable for the material of the flow path forming member 4. However, resistance or the like largely depends on a liquid such as ink to be used and characteristics thereof, so an appropriate compound other than the above-mentioned material may be selected depending on the liquid to be used.

Then, when the ink supply port 9 which is a through hole penetrating through the silicon substrate 1101 is formed, processing is performed such that an etchant does not come into contact with a surface on which a function element (e.g., heat acting portion 1108 or drive circuit) of the ink jet head is formed or a side surface of the silicon substrate 1101. Specifically, a protective material 1011 made of resin is applied by spin-coating or the like so as to cover a portion which must not come into contact with the etchant. As a material for the protective material 1011, a material having a sufficient resistance to a strong alkaline liquid to be used when anisotropic etching is performed is used. Even the upper surface side of the flow path forming portion 4 is coated with the protective material 1011, thereby preventing the water repellent layer 1006 from being deteriorated as well.

Figure 5C:
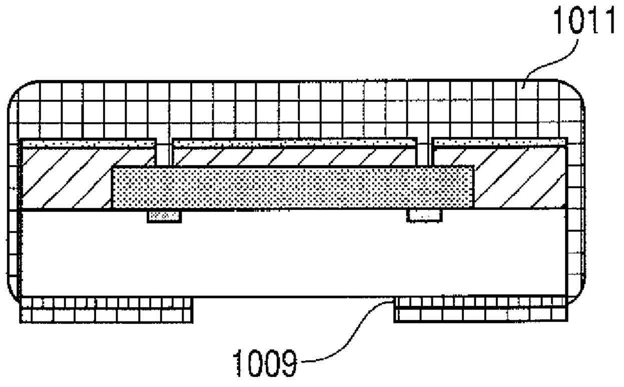

Then, by the use of the patterning mask 1008 which was formed in advance, the silicon oxide film 1007 was patterned by wet etching or the like, to thereby form an opening portion 1009 from which the back surface of the silicon substrate 1101 is exposed (FIG. 5C).

Then, the ink supply port 9 was formed by anisotropic etching using the silicon oxide film 1007 as a mask.

Figure 5D:
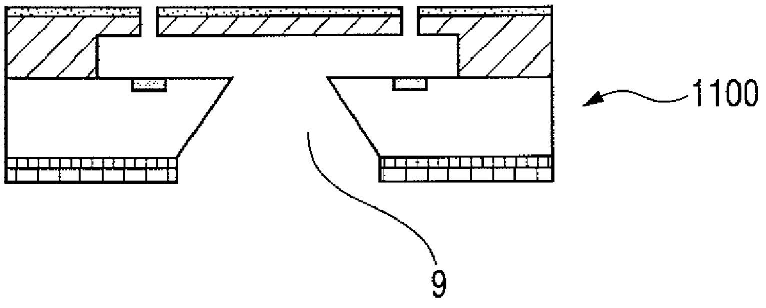

After that, the patterning mask 1008 and the protective material 1011 were removed. Then, the mold material 1003 was dissolved and removed from the ink discharge ports 5 and the ink supply port 9 (FIG. 5D). The dissolution and removal of the mold material 1003 can be carried out by performing development after entire surface exposure with deep UV light. At the time of development, when ultrasonic immersion was performed as needed, the mold material 1003 could be removed.

The ink jet head thus produced can be mounted to a facsimile including a printer, a copying machine, and a communication system, an apparatus such as a word processor having a printer portion, and further to a recording apparatus for industrial use which is complexly combined with various processing apparatuses. By the use of the ink jet head, it is possible to perform recording on various recording media such as paper, string, fiber, cloth, hide, metal, plastic, glass, lumber, and ceramics.

It should be noted that in this specification, the "recording" means not only to apply an image having meaning such as a character or a figure to the recording media, but also to apply an image having no meaning such as a pattern thereto.

Next, an ink jet cartridge (FIG. 7) in a mode of a cartridge in which an ink jet head and an ink tank are integrated with each other, and an ink jet recording apparatus (FIG. 8) using the ink jet cartridge will be described.

Figure 7:
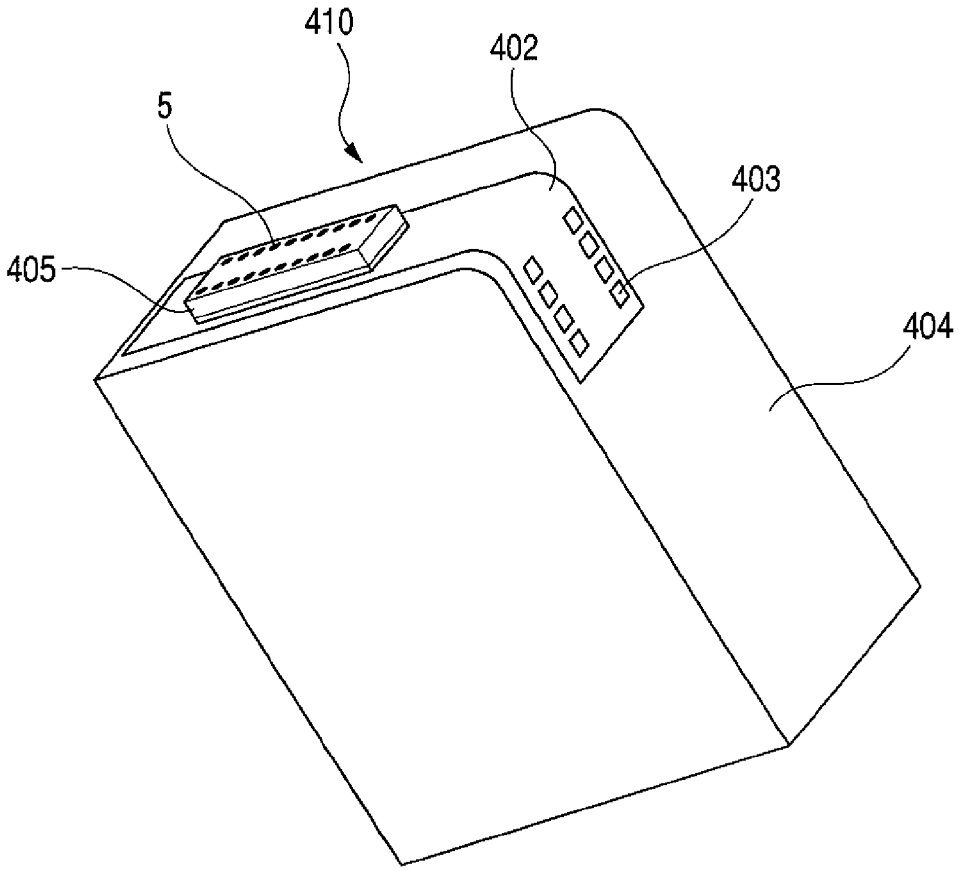
FIG. 7 is a schematic perspective view of an ink jet cartridge constituted by using the ink jet head shown in FIG. 4.

FIG. 7 is a view illustrating an example of a structure of an ink jet cartridge 410 having a mode of a cartridge mountable to a recording apparatus.

A tape member 402 for tape automated bonding (TAB) having a terminal for supplying power to the ink jet cartridge 410 from an outside is disposed on a surface of a casing. In the ink jet cartridge 410, an ink tank portion 404 and an ink jet head portion 405 are arranged, and wirings of the ink jet head portion 405 are connected to wirings (not shown) extending from terminals 403 of the tape member 402 for TAB.

Figure 8:
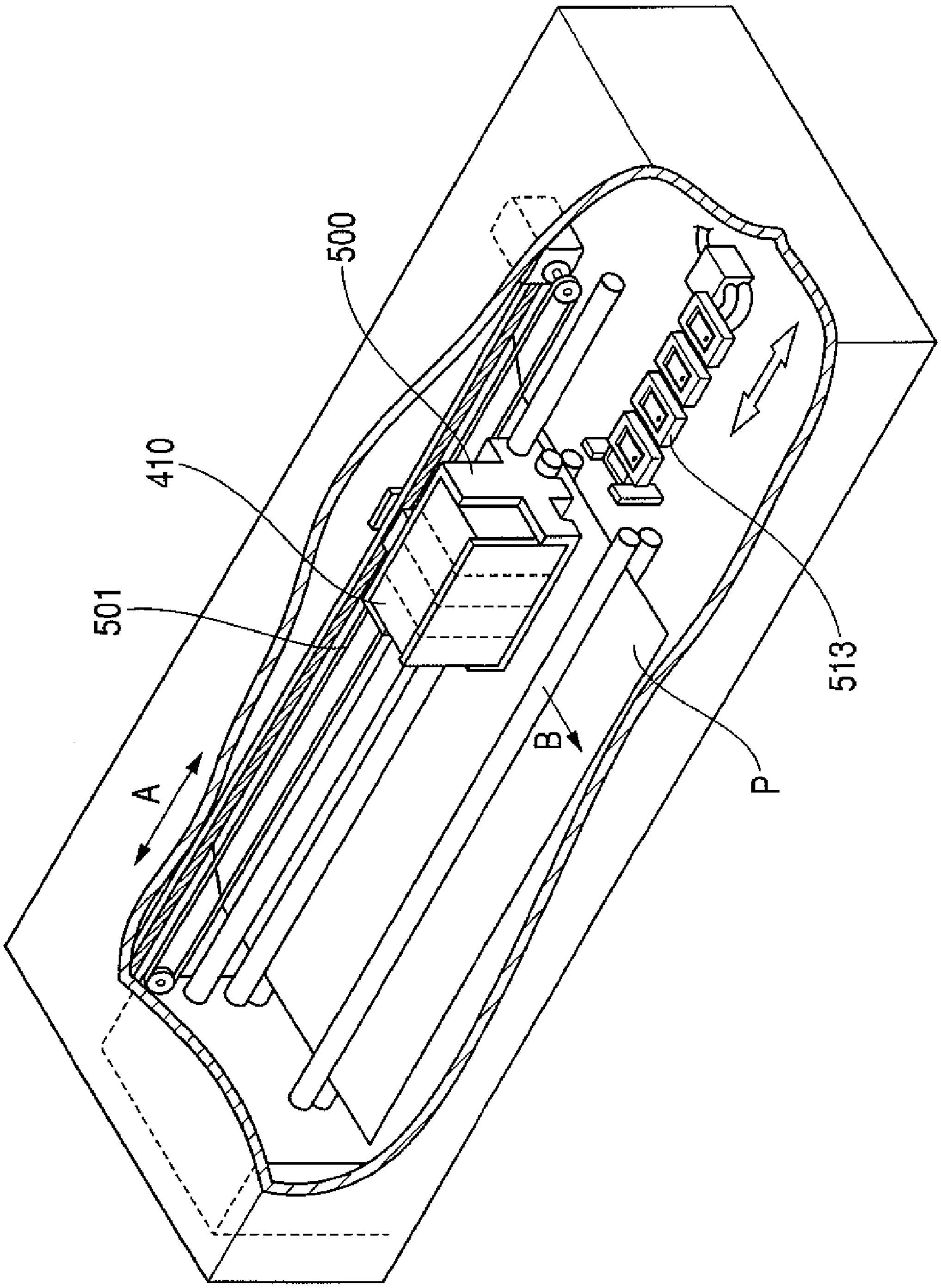
FIG. 8 is a schematic perspective view illustrating an example of a structure of an ink jet recording apparatus using the ink jet cartridge shown in FIG. 7.

FIG. 8 is a view illustrating an example of a schematic structure of an ink jet recording apparatus for performing recording using the ink jet cartridge 410 of FIG. 7.

The ink jet recording apparatus is provided with a carriage 500 which is fixed to an endless belt 501 and performs main scanning in a reciprocating direction (direction indicated by the arrow A in the figure) along a guide shaft 502.

On the carriage 500, the ink jet cartridge 410 in a mode of a carriage is mounted. The ink jet cartridge 410 is mounted on the carriage 500 such that the discharge ports 5 of the ink jet head portion 405 oppose a sheet P serving as a recording medium, and a direction in which the discharge ports 5 are arranged becomes a direction opposite to a main scanning direction (e.g., sub-scanning direction which is transport direction of sheet P). Note that the number of pairs of the ink jet head portion 405 and the ink tank portion 404 to be provided may correspond to the number of ink colors to be used. In the illustrated example, four pairs thereof are provided corresponding to four colors (e.g., black, yellow, magenta, and cyan).

The recording sheet P serving as a recording medium is transported intermittently in a direction indicated by the arrow B orthogonal to a moving direction of the carriage 500.

In the above-mentioned structure, with the movement of the carriage 500, recording on the entire recording sheet P is executed by alternately repeating execution of recording with a width corresponding to a length of the row of the discharge ports 5 of the ink jet cartridge 410, and transportation of the recording sheet P.

It should be noted that the carriage 500 is stopped at a predetermined position called "home position" at the start of the recording or during the recording as needed. At the home position, there are provided cap members 513 for capping surfaces (surfaces of discharge ports) on which the discharge ports 5 of the ink jet cartridges 410 are provided. The cap members 513 are connected to suction recovery means (not shown) for forcibly sucking ink from the discharge ports 5 to thereby prevent clogging or the like of the discharge ports 5.

Example 1-2

Figure 3:
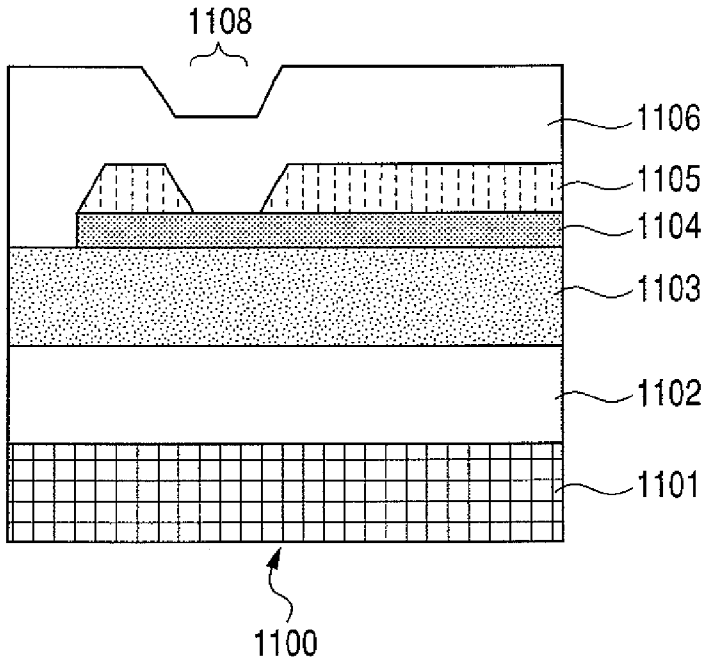
FIG. 3 is a schematic cross-sectional diagram of the ink jet head substrate in the vicinity of the heat acting portion thereof according to the example of the present invention.

In an ink jet head substrate 1100 according to an example of the present invention, unlike the ink jet head substrate 1100 of FIG. 2, the upper portion protective layer 1107 is not formed on the insulating protective layer 1106 (FIG. 3).

First, in the same manner as in Example 1-1, an SiN film serving as the insulating protective layer 1106 was formed by the Cat-CVD method.

As source gases, an $NH_3$ gas of 50 sccm, an $SiH_4$ gas of sccm, and an $H_2$ gas of 100 sccm were respectively introduced into the deposition chamber 301. Film formation was performed under conditions that the pressure inside the deposition chamber 301 at the time of film formation was set to 5 Pa, the temperature of the heater 304 was set to 1700° C., and the substrate temperature was set to 350°. The insulating protective layer 1106 thus formed had a layer thickness (film thickness) of 250 nm and a film stress of 150 MPa (tensile stress).

Example 1-3

An ink jet head substrate 1100 according to an example of the present invention was formed such that a composition of the insulating protective layer 1106 formed of an SiN film was changed in a layer thickness (film thickness) direction by using the Cat-CVD method. The other processes are the same as those of Example 1-2. The insulating protective layer 1106 was formed such that a side thereof in contact with ink has more Si compositions than those on a side in contact with the heating resistor layer. This is obtained by setting a flow rate of the $SiH_4$ gas to be increased toward the side in contact with ink from the side in contact with the heating resistor layer when film formation is performed by the Cat-CVD method.

First, film formation was started under conditions that an $NH_3$ gas of 50 sccm, an $H_2$ gas of 100 sccm, and an $SiH_4$ gas of 5 sccm were used, the pressure inside the deposition chamber 301 at the time of film formation was set to 5 Pa, the temperature of the heater 304 was set to 1700° C., and the substrate temperature was set to 350°. After that, the amount of the $SiH_4$ gas was gradually increased, and the insulating protective layer 1106 formed of an SiN film with a thickness of 300 nm was formed. At this time, the film stress was −150 MPa (compression stress).

Example 1-4

An ink jet head substrate 1100 according to an example of the present invention has the same structure as that of FIG. 3 described in Example 1-2. The insulating protective layer 1106 formed of an SiN film with a thickness of 200 nm was formed by using the Cat-CVD method.

As film formation conditions, an $NH_3$ gas of 10 sccm, an $SiH_4$ gas of 5 sccm, and an $H_2$ gas of 20 sccm were used, the pressure inside the deposition chamber 301 at the time of film formation was set to 5 Pa, the temperature of the heater 304 was set to 1700° C., and the substrate temperature was set to 380° C. At this time, the film stress was 100 MPa (tensile stress).

Example 1-5

In an ink jet head substrate 1100 according to an example of the present invention, under the same conditions as the film formation conditions described in Example 1-4, the insulating protective layer 1106 formed of an SiN film whose thickness was changed was formed by using the Cat-CVD method. The film thickness thereof was 100 nm.

Example 1-6

In an ink jet head substrate 1100 according to an example of the present invention, under the same conditions as the film formation conditions described in Example 1-2, the insulating protective layer 1106 formed of an SiN film whose thickness was changed was formed by using the Cat-CVD method. The film thickness thereof was 500 nm.

Example 1-7

An ink jet head substrate 1100 according to an example of the present invention has the same structure as that of FIG. 3 described in Example 1-2. The insulating protective layer 1106 formed of an SiON film with a thickness of 300 nm was formed by using the Cat-CVD method.

As film formation conditions, an $NH_3$ gas of sccm, an $SiH_4$ gas of 10 sccm, an $H_2$ gas of 400 sccm, an $O_2$ gas of 200 sccm were used, the pressure inside the deposition chamber 301 at the time of film formation was set to 20 Pa, the temperature of the heater 304 was set to 1750° C., and the substrate temperature was set to 50° C. At this time, the film stress was 500 MPa (tensile stress).

Example 1-8

An ink jet head substrate 1100 according to an example of the present invention has the same structure as that of FIG. 3 described in Example 1-2. The insulating protective layer 1106 formed of an SiN film with a thickness of 230 nm was formed by using the Cat-CVD method.

As film formation conditions, an $NH_3$ gas of 10 sccm, an $SiH_4$ gas of 5 sccm, and an $H_2$ gas of 20 sccm were used, the pressure inside the deposition chamber 301 at the time of film formation was set to 6 Pa, the temperature of the heater 304 was set to 1700° C., and the substrate temperature was set to 400° C. At this time, the film stress was 100 MPa (tensile stress).

Comparative Example 1-1

An ink jet head substrate was produced in the same manner as described in Example 1-2 except that the insulating protective layer was formed by using the plasma CVD method.

As film formation conditions, an $SiH_4$ gas and an $NH_3$ gas were used, the substrate temperature was 400° C., the pressure inside the deposition chamber at the time of film formation was 0.5 Pa, the film thickness was 250 nm, and the film stress was −900 MPa (compression stress).

Comparative Example 1-2

A comparative example of the present invention has a structure in which, under the SiN film provided in the above-mentioned examples and Comparative Example 1, a PSG film (first protective layer) with a thickness of 700 nm was formed by using the plasma CVD method prior to the formation of the SiN film. Then, on the PSG film, an SiN film serving as a second protective layer with a thickness of 300 nm was formed. The film stress thereof was −500 MPa (compression stress).

Comparative Example 1-3

An example of the present invention has a layer structure in which the first protective layer is not formed as in the above-mentioned examples and Comparative Example 1. According to this comparative example, an SiN film corresponding to the second protective layer with a thickness of 300 nm was formed by using the plasma CVD method, and a tantalum film with a thickness of 250 nm was formed thereon. The film stress thereof was −300 MPa (compression stress).

(Evaluation of Ink Jet Head Substrate and Ink Jet Head)

(Evaluation Results of Ink Resistance)

The SiN film has poorer resistance to alkali than acid. Accordingly, each of the ink jet head substrates according to Examples 1-2 to 1-8 and Comparative Examples 1-1 and 1-2 in each of which the upper portion protective layer (Ta film) was not formed was immersed in alkalescent ink of pH 9 and was left in a temperature-controlled bath of 70° C. for three days. Then, a change in thickness of the insulating protective layer after being immersed was observed in comparison with the layer thickness (film thickness) thereof before being immersed.

As a result, in the ink jet head substrate according to Comparative Examples 1-1 and 1-2, the SiN film was reduced in thickness by about 80 nm. In contrast, in the ink jet head substrate according to Examples 2-1 to 1-6, the SiN film was reduced in thickness by about 10 nm. Also in the ink jet head substrate according to Example 1-7, the $SiO_x$ film was reduced in thickness by about 10 nm. From the fact, it was found that the SiN film and the SiON film that were formed by using the Cat-CVD method had ink resistance seven times as much as that of the conventional SiN film formed by using the plasma CVD method.

In addition, it was found that also Example 1-3 in which the nitrogen composition of the SiN film was changed had ink resistance the same as that of the SiN film in which the composition was not changed. From the fact, it was found that the SiN film formed by using the Cat-CVD method had ink resistance higher than that of the $SiO_x$ film formed by the conventional plasma CVD method, irrespective of the nitrogen composition.

It should be noted that the layer thickness (film thickness) of the protective layer was measured using an ellipsometer at five positions thereof to obtain a mean value to be used.

In each of Examples 1-2 to 1-8, reduction in layer thickness (film thickness) of only about nm was measured. From the fact, it was found that the SiN film formed by using the Cat-CVD method had higher ink resistance than that of the conventional SiN film formed by using the plasma CVD method.

This shows that the SiN film formed by using the Cat-CVD method has an excellent ink resistance as compared with the conventional SiN film formed by the plasma CVD method and used as an insulating protective layer (insulating protective film), so a sufficient protection performance can be obtained even when the film is thinned. As a result, by making the film thickness of the SiN film thinner than that of the conventional case, heat transfer from the heating portion 1104*a* to ink can be improved, so an ink jet head having higher energy efficiency can be obtained.

The evaluation results of the protective layers produced according to the examples, comparative examples, and a conventional method are shown in Table 1.

TABLE 1

| | First Protective Layer nm | Second Protective Layer nm | Upper Portion Protective Layer nm | Etching-resistive Property nm | Stress MPa | Ink resistance |
|---|---|---|---|---|---|---|
| Example 1-1 | None | 250 SiN Cat-CVD | 200 Ta Sputtering | 10 | 200 | ○ |
| Example 1-2 | None | 250 SiN Cat-CVD | None | 10 | 150 | ○ |
| Example 1-3 | None | 300 SiN Cat-CVD | None | 10 | −150 | ○ |
| Example 1-4 | None | 200 SiN Cat-CVD | None | 10 | 100 | ○ |
| Example 1-5 | None | 100 SiN Cat-CVD | None | 10 | 100 | ○ |
| Example 1-6 | None | 500 SiN Cat-CVD | None | 10 | 150 | ○ |
| Example 1-7 | None | 300 SiON Cat-CVD | None | 10 | 500 | ○ |
| Example 1-8 | None | 230 SiN Cat-CVD | None | 10 | 100 | ○ |
| Prior Art | 700 PSG Plasma CVD | 300 SiN Cat-CVD | 250 Ta Sputtering | 80 | 900 | ○ |
| Comparative example 1-1 | None | 300 SiN Cat-CVD | None | 80 | −900 | X |
| Comparative example 1-2 | 700 PSG Plasma CVD | 300 SiN Cat-CVD | None | 80 | −500 | X or Δ |
| Comparative example 1-3 | None | 300 SiN Cat-CVD | 250 Ta Sputtering | 90 | −300 | X or Δ |

In the Tables, symbols, "○" means "excellent", "Δ" "not good and not bad" and "x" "bad", respectively.

(Head Characteristics)

Next, each of the ink jet heads including the ink jet head substrate according to Examples 1-1 to 1-8 and Comparative Example 1-1 was mounted to the ink jet recording apparatus, and measurement of a foaming start voltage Vth for starting discharge of ink, and a recording durability test were carried out. This test was conducted by recording a general test pattern which is incorporated in the ink jet recording apparatus, on a sheet of an A-4 size (according to Japanese Industrial Standards). At this time, a pulse signal having a drive frequency of 15 KHz and a drive pulse width of 1 μs was applied to thereby obtain the foaming start voltage Vth. The results are shown in Table 2.

TABLE 2

| | Foaming Start Voltage Vth [V] | Drive Voltage Vop [V] |
|---|---|---|
| Example 1-1 | 18.0 | 23.4 |
| Example 1-2 | 14.5 | 18.9 |
| Example 1-3 | 14.6 | 19.0 |
| Example 1-4 | 14.2 | 18.5 |
| Example 1-5 | 13.1 | 17.0 |
| Example 1-6 | 15.5 | 20.2 |
| Example 1-7 | 14.7 | 19.1 |
| Example 1-8 | 14.3 | 18.6 |
| Comparative example 1-1 | 15.0 | 19.5 |

In the structure of FIG. 2 in which the insulating protective layer 1106 was formed by the Cat-CVD method and the upper portion protective layer 1107 was formed with a film thickness of 300 nm, the foaming start voltage Vth was 18.0 V (Example 1-1).

Further, as in the structure of FIG. 3 in which the upper portion protective layer 1107 was not formed and the insulating protective layer 1106 was in contact with ink (Example 1-2), a result in which the foaming start voltage Vth was 14.5 V as shown in Table 2 was obtained. As apparent from Table 2, in each of the examples, the foaming start voltage Vth was reduced by about 10 to 15%, and improvement in power consumption was found.

Further, also in Example 1-3 in which the composition of the insulating protective layer 1106 formed of an SiN film was changed in the film thickness direction, or in Examples 1-4 to 1-6 and 108 in which the film thickness of the insulating protective layer 1106 formed of an SiN film was changed, reduction in Vth was found as in Table 2.

Further, in Example 1-7 in which the insulating protective layer formed of an SiON film was formed, reduction in Vth was found as in Table 2.

In Example 1-6, a value of the foaming start voltage Vth was higher than that of Comparative Example 1-1, which is because the thickness of the second protective layer is increased to 500 nm. When evaluation was performed in terms of the same thickness, improvement in power consumption was found.

Then, assuming that a voltage 1.3 times as large as the Vth was set as a drive voltage Vop, recording of a standard document of 1500 words was performed. As a result, it was confirmed that each of the ink jet heads according to Examples 1-1 to 1-8 could perform recording of 5000 sheets or more of the document, and deterioration in recording quality was not found.

On the other hand, the ink jet head according to Comparative Example 1-1 could perform recording of about 1000 sheets of the document, but after that, the recording was impossible. By confirming the cause thereof, it was found that breaking of wirings occurred mainly due to cavitation and elution by ink in the insulating protective layer.

Specifically, it was found that the ink jet head according to this embodiment using the insulating protective layer formed by the Cat-CVD method could provide images stable for a long period of time and had excellent durability.

Second Embodiment

In the ink jet head substrate, when a large number of heating resistor layers, electrode wirings, and the like are formed at a high density, the width of the electrode wiring becomes narrower in some cases. Considering the constant power supply, the film thickness of the electrode wiring becomes thick, which results in increase in size of the step of the wiring end portion.

The film obtained by the Cat-CVD method is a dense film having high coverage. When the step becomes larger, growth conditions which satisfy the coverage and denseness of the film at the same time can be obtained. However, an allowable range of the film growth conditions was narrow and the mass productivity was reduced in some cases.

Accordingly, the insulating protective film formed on a wiring side such as the electrode wiring, the heating resistor layer, or the heating portion is formed under the growth conditions with high coverage. On the other hand, the insulating protective film on the side closer to ink is formed as a dense insulating film with high ink resistance. With this structure, the insulating protective film having both the ink resistance and the step coverage can be obtained.

Example 2-1

Hereinafter, Example 2-1 will be described with reference to the drawings.

Figure 9:
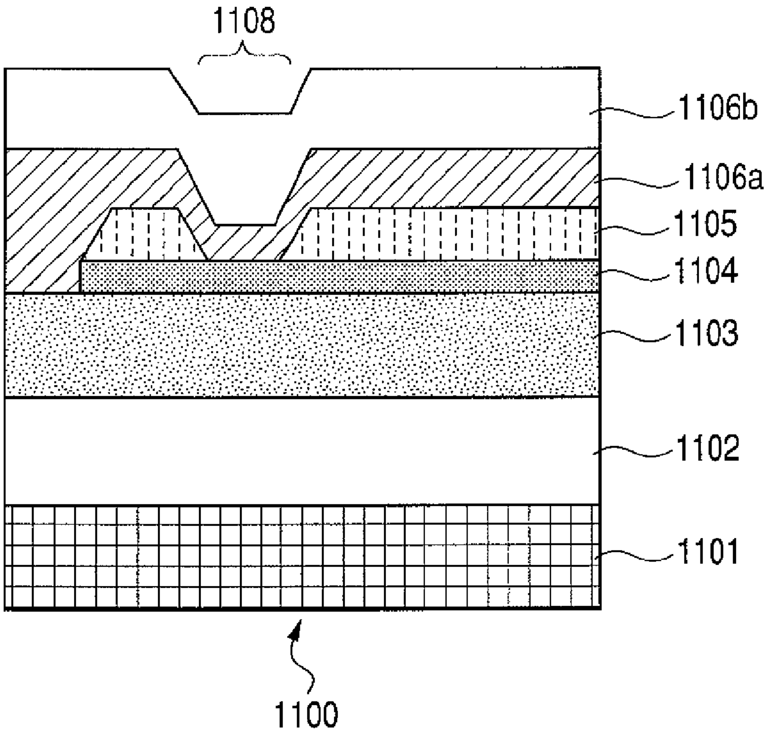
FIG. 9 is a schematic cross-sectional diagram of an ink jet head substrate in the vicinity of a heat acting portion thereof according to the example of the present invention.

FIG. 9 is a schematic cross-sectional diagram of an ink jet head substrate 1100 according to Example 2-1 in the vicinity of a heat acting portion 1108.

As shown in FIG. 9, on the ink jet head substrate 1100 formed of the silicon substrate 1101, the heat accumulation layer 1102 and the interlayer film 1103 are formed in the stated order. On the interlayer film 1103, the heating resistor layer 1104 and the electrode wiring layer 1105 are formed in the stated order. A part of the electrode wiring layer 1105 is removed to expose the heating resistor layer, thereby forming the heating portion **1104*a*. The heating resistor layer 1104 and the electrode wiring layer 1105 each have a wiring pattern as shown in FIG. 1**.

In this example, on the electrode wiring layer 1105 or the heating resistor layer 1104, or on a wiring layer made of conductive materials such as the heating portion **1104*a*, a first protective layer 1106*a* and a second protective layer 1106*b* are further formed in the stated order. Specifically, in this example, the first protective layer 1106*a* is formed on a side where the electrode wiring layer or the like is formed, and the second protective layer 1106*b*** is formed on an ink (liquid) flow path side. Except for the difference, a method of manufacturing the ink jet head according to this example is the same as that of the first embodiment.

In other words, after the electrode wiring layer 1105 was formed, an SiN film with a thickness of 150 nm was subsequently formed as the first protective film **1106*a* by using the Cat-CVD method. After that, an SiN film with a thickness of 100 nm was subsequently formed as the second protective film 1106***b* by using the Cat-CVD method, and patterning was performed to thereby obtain the ink jet head substrate 1100 shown in FIG. 9.

In this example, film formation using the apparatus shown in FIG. 6 was performed in the following manner.

The chamber 301 was reduced in pressure by exhausting air using the exhaust pump 305 until a pressure inside thereof becomes $1\times10^{-5}$ Pa to $1\times10^{-6}$ Pa. Then, an $NH_3$ gas of 200 sccm was introduced into the deposition chamber 301 from the gas inlet 303. At this time, a heater (not shown) for heating the substrate was adjusted to obtain the substrate temperature of 300° C. In addition, an external power source was adjusted to heat up the temperature of the heater 304 serving as a heating catalytic member to 1700° C.

Next, as source gases, an $SiH_4$ gas of 10 sccm, an $NH_3$ gas of 100 sccm, and an $H_2$ gas of 400 sccm were respectively introduced into the chamber 301. Then, by catalyzed degradation of those gases, on the surface of the silicon substrate 1101 placed on the substrate holder 302, an SiN film serving as the first protective layer 1106*a* was formed. Note that the pressure inside the deposition chamber when film formation was performed by introducing the gases was 5 Pa. The SiN film formed at this time had a thickness of 150 nm and a film stress of 200 MPa (tensile stress).

Subsequently, by changing the conditions of the source gas, the second protective layer was formed. The SiN film serving as the second protective layer 1106*b* was formed under conditions that flow rates of the source gases used in this case were set such that the $SiH_4$ gas was 5 sccm and the $NH_3$ gas was 200 sccm, the pressure inside the deposition chamber 301 at the time of film formation was 5 Pa, the temperature of the heater 304 was 170° C., and the substrate temperature was 200° C. The SiN film formed at this time had a thickness of 100 nm and a film stress of 400 MPa (tensile stress).

The ink jet head 1100 including the ink jet recording head substrate 1101 is the same as the ink jet recording head shown in FIG. 4 according to Example 1-1 of the first embodiment. Accordingly, detailed description thereof will be omitted.

A method of producing the ink jet head of this example is the same as that described with reference to the schematic cross-sectional process diagrams of FIGS. 5A to 5D according to Example 1-1 of the first embodiment. Accordingly, detailed description thereof will be omitted.

The ink jet cartridge (FIG. 7) having a mode of the cartridge in which the ink jet head and the ink tank are integrated with each other, and the ink jet recording apparatus (FIG. 8) using the ink jet cartridge are the same as those described in Example 1-1 of the first embodiment. Accordingly, detailed description thereof will be omitted.

Example 2-2

Figure 10:
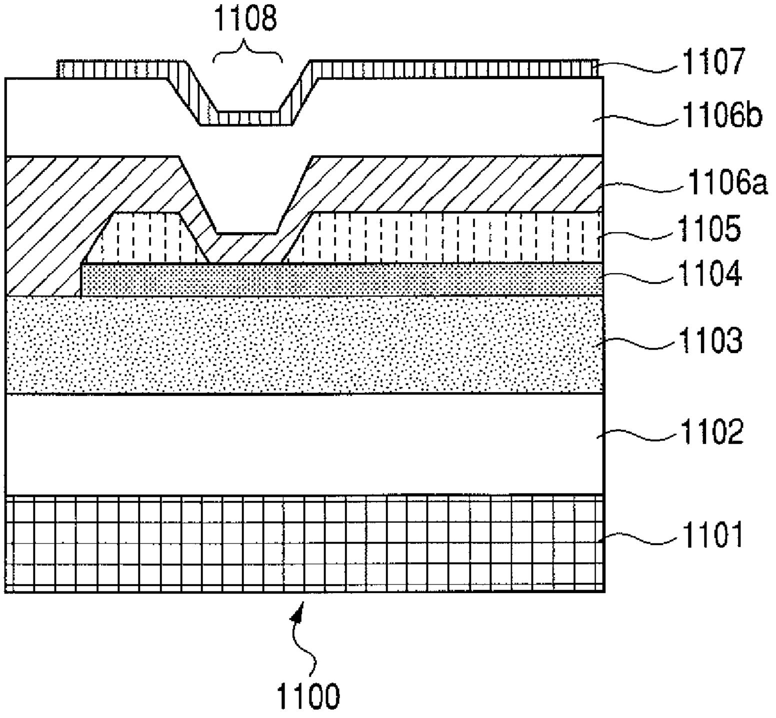
FIG. 10 is a schematic cross-sectional diagram of the ink jet head substrate in the vicinity of the heat acting portion thereof according to the example of the present invention.

In Example 2-2, unlike the above-mentioned FIG. 9, as shown in FIG. 10, on the first protective layer 1106*a* and the second protective layer 1106*b*, the upper portion protective layer 1107 is formed.

In the same manner as in Example 2-1, on the first protective layer 1106*a* with a thickness of 150 nm which was formed of the SiN film formed by the Cat-CVD method, the second protective layer 1106*b* with a thickness of 100 nm formed of the SiN film formed by the Cat-CVD method was formed. Film formation at this time was performed under the same film formation conditions as those of Example 2-1.

Finally, a tantalum film with a thickness of 100 nm was formed as the upper portion protective layer 1107 by the sputtering method, and patterning was performed to thereby obtain the ink jet head substrate 1100 shown in FIG. 10.

The upper portion protective layer 1107 formed of the tantalum film has heat conductivity higher than that of the first protective layer 1106*a* and the second protective layer 1106*b*, which does not lower the thermal efficiency to a large extent. In addition, the upper portion protective layer 1107 was formed directly on the second protective layer 1106*b* which was a dense insulating protective layer, so the heat energy from the heating portion 1104*a* could be transferred to the heat acting portion 1108 with efficiency.

Example 2-3

In an example of the present invention, assuming that the protective layer has a double layer structure similar to that of Example 2-1, the first protective layer 1106 and the second protective layer 1106*b* were formed.

First, as the first protective layer 1106*a*, an SiOC film with a thickness of 100 nm was formed by the Cat-CVD method. The film formation was performed under conditions that TEOS of 15 sccm was used as a source gas of this case, the pressure inside the deposition chamber 301 at the time of film formation was set to 10 Pa, the temperature of the heater 304 was set to 1700° C., and the substrate temperature was set to 200° C. At this time, the film thickness was 100 nm and the film stress was 500 MPa (tensile stress).

Next, on the first protective layer 1106*a*, the second protective layer 1106*b* formed of the SiN film was formed by the Cat-CVD method. As film formation conditions, an $NH_3$ gas of 500 sccm, an $SiH_4$ gas of 5 sccm, and an $H_2$ gas of 100 sccm were used, the pressure inside the deposition chamber 301 at the time of film formation was set to 4 Pa, the temperature of the heater 304 was set to 1700° C., and the substrate temperature was set to 200° C. At this time, the film thickness was 100 nm and the film stress was 400 MPa (tensile stress).

Example 2-4

In an example of the present invention, assuming that the protective layer has a double layer structure similar to that of Example 2-1, the first protective layer 1106*a* and the second protective layer 1106*b* were formed.

First, as the first protective layer 1106*a*, an SiOC film with a thickness of 120 nm was formed by the Cat-CVD method. The film formation was performed under conditions that an HMDS gas of 30 sccm and an $NH_3$ gas of 10 sccm were used, the pressure inside the deposition chamber 301 at the time of film formation was set to 10 Pa, the temperature of the heater 304 was set to 1700° C., and the substrate temperature was set to 200° C. At this time, the film thickness was 120 nm and the film stress was 500 MPa (tensile stress).

Next, on the first protective layer 1106*a*, the second protective layer 1106*b* formed of the SiN film was formed by the Cat-CVD method. As film formation conditions, an $NH_3$ gas of 50 sccm, an $SiH_4$ gas of 8 sccm, and an $H_2$ gas of 100 sccm were used, the pressure inside the deposition chamber 301 at the time of film formation was set to 5 Pa, the temperature of the heater 304 was set to 1700° C., and the substrate temperature was set to 150° C. At this time, the film thickness was 80 nm and the film stress was 300 MPa (tensile stress).

Example 2-5

In an example of the present invention, the first protective layer 1106*a* and the second protective layer 1106*b* were formed in the stated order, and a third protective layer was further formed on the second protective layer 1106*b*.

First, as the first protective layer 1106*a*, an SiOC film with a thickness of 100 nm was formed by the Cat-CVD method. As film formation conditions, TEOS of 5 sccm and an $O_2$ gas of 10 sccm were used, the pressure inside the deposition chamber 301 at the time of film formation was set to 10 Pa, the temperature of the heater 304 was set to 1700° C., and the substrate temperature was set to 250° C. At this time, the film thickness was 100 nm and the film stress was 400 MPa (tensile stress).

Next, on the first protective layer 1106*a*, the second protective layer 1106*b* formed of an SiN film with a thickness of 100 nm was formed by the Cat-CVD method. As film formation conditions, an HMDS gas of 40 sccm and an $NH_3$ gas of 10 sccm were used, the pressure inside the deposition chamber 301 at the time of film formation was set to 10 Pa, the temperature of the heater 304 was set to 1700° C., and the substrate temperature was set to 200° C. At this time, the film thickness was 100 nm and the film stress was 400 MPa (tensile stress).

Finally, on the second protective layer 1106*b*, the third protective layer formed of an SiN film was formed by the Cat-CVD method. As film formation conditions, an $NH_3$ gas of 50 sccm, an $SiH_4$ gas of 7 sccm, and an $H_2$ gas of 100 sccm were used, the pressure inside the deposition chamber 301 at the time of film formation was set to 4 Pa, the temperature of the heater 304 was set to 1700° C., and the substrate temperature was set to 250° C. At this time, the film thickness was 50 nm and the film stress was 500 MPa (tensile stress).

Example 2-6

In an example of the present invention, assuming that the protective layer has a double layer structure similar to that of Example 2-1, the first protective layer 1106*a* and the second protective layer 1106*b* were formed.

First, as the first protective layer 1106*a*, an SiOC film with a thickness of 100 nm was formed by the Cat-CVD method. As film formation conditions, TEOS of 15 sccm was introduced into the chamber 301, the pressure inside the deposition chamber 301 at the time of film formation was set to 10 Pa, the temperature of the heater 304 was set to 1700° C., and the substrate temperature was set to 200° C. At this time, the film thickness was 100 nm and the film stress was 500 MPa (tensile stress).

Next, on the first protective layer 1106*a*, the second protective layer 1106*b* formed of an SiN film was formed by the Cat-CVD method. As film formation conditions, an $NH_3$ gas of 50 sccm, an $SiH_4$ gas of 5 sccm, and an $H_2$ gas of 100 sccm were used, the pressure inside the deposition chamber 301 at the time of film formation was set to 4 Pa, the temperature of the heater 304 was set to 1700° C., and the substrate temperature was set to 200° C. At this time, the film thickness was 300 nm and the film stress was 500 MPa (tensile stress).

Comparative Example 2-1

Except that the protective layer (insulating protective layer) was formed by using the plasma CVD method, the ink jet head substrate was produced in the same manner as in Example 2-1. As film formation conditions, an $SiH_4$ gas and an $NH_3$ gas were used, the substrate temperature was set to 400° C., the pressure inside the deposition chamber at the time of film formation was set to 0.5 Pa, the film thickness was set to 250 nm, and the film stress was set to −900 MPa (compression stress).

(Evaluation of Ink Jet Head Substrate and Ink Jet Head)

(Evaluation Results of Ink Resistance)

Each of the ink jet head substrates according to Example 2-1, Examples 2-3 to 2-6, and Comparative Example 2-1, in each of which the upper portion protective layer (Ta film) was not formed, was immersed in ink and was left in a temperature-controlled bath of 70° C. for three days. Then, a change in thickness of the insulating protective layer after being immersed was observed in comparison with the layer thickness (film thickness) thereof before being immersed. In this case, since the SiN film and the SiON film are more liable to be etched in an alkaline liquid than acid, alkalescent ink of about pH 9 was used for the test of the ink resistance.

As a result, in the ink jet head substrate according to Comparative Example 2-1, the SiN film was reduced in thickness by about 80 nm. In contrast, in the ink jet head substrates according to examples of this embodiment, the SiN film was reduced in thickness by only about 10 nm. From the fact, it was found that the protective layers of the examples which were formed by the Cat-CVD method had higher ink resistance.

It was found that, as compared with the conventional SiN film formed by the plasma CVD method and used as an insulating protective film (insulating protective layer), as in the examples of this embodiment, multiple insulating protective layers formed by the Cat-CVD method had an excellent ink resistance. In addition, it is found that the insulating protective film according to the examples of this embodiment has high coverage without generating cracking of the step of the insulating protective film, or the like.

In other words, the insulating protective layer formed of multiple protective layers has a structure in which a protective layer that is formed as a relatively flexible film and has high coverage are formed on the wiring side, and a protective layer having an excellent ink resistance is formed on the ink (liquid) flow path side. With this structure, an insulating protective layer suitable for the liquid discharge head or the ink jet head and having high coverage and excellent ink resistance was obtained.

(Head Characteristics)

Next, each of the ink jet heads including the ink jet head substrates according to the examples of this embodiment and Comparative Example 2-1 was mounted to the ink jet recording apparatus, and measurement of the foaming start voltage Vth for starting discharge of ink, and a recording durability test were carried out. This test was conducted by recording a general test pattern which is incorporated in the ink jet recording apparatus, on an A-4 sheet. At this time, a pulse signal having a drive frequency of 15 KHz and a drive pulse width of 1 μs were applied to thereby obtain the foaming start voltage Vth. The results are shown in Table 3.

TABLE 3

| | Foaming Start Voltage Vth [V] | Drive Voltage Vop [V] |
|---|---|---|
| Example 2-1 | 14.2 | 18.5 |
| Example 2-2 | 17.0 | 22.1 |
| Example 2-3 | 14.0 | 18.2 |
| Example 2-4 | 14.0 | 18.2 |
| Example 2-5 | 14.5 | 18.9 |
| Example 2-6 | 15.4 | 20.0 |
| Comparative example 2-1 | 15.0 | 19.5 |

In the structure of FIG. 9 in which the first protective layer 1106*a* was formed of the SiN film by the Cat-CVD method and the second protective layer 1106*b* was formed of the SiN film by the Cat-CVD method, the foaming start voltage Vth was 14.2 V (Example 2-1). Also in the other examples, the same results were obtained. As apparent from Table 3, in each of the examples, the foaming start voltage Vth was reduced by about 10 to 15%, and improvement in power consumption was found.

In Example 2-6, the foaming start voltage Vth becomes higher because the first protective layer and the second protective layer are formed with a total thickness of 400 nm. However, the thickness is within a range where discharge of ink can be actually driven, so Example 2-6 has a desirable structure for performing ink jet recording for a long period of time.

Then, assuming that a voltage 1.3 times as large as the Vth was set as the drive voltage Vop, recording of a standard document of 1500 words was performed. As a result, it was confirmed that each of the ink jet heads according to Examples 2-1 to 2-6 could perform recording of 5000 sheets or more of the document, and deterioration in recording quality was not found.

On the other hand, the ink jet head according to Comparative Example 2-1 could perform recording of about 1000 sheets of the document, but after that, the recording was impossible. By confirming the cause thereof, it was found that breaking of wirings occurred mainly due to cavitation and elution by ink in the insulating protective layer.

Specifically, it was found that the ink jet head according to this embodiment which uses the insulating protective layer formed by the Cat-CVD method could provide images stable for a long period of time and had excellent durability.

Third Embodiment

A protective layer (insulating protective layer or insulating protective film, or simple protective film) having a laminated structure according to an embodiment of the present invention has a protective layer formed by the Cat-CVD method on the ink (liquid) flow path side (side closer to ink) as in the second embodiment. A difference in structure from the second embodiment resides in that, at a lower side of the protective layer formed by the Cat-CVD method, a protective layer was formed on the wiring side of the electrode wiring layer, the heating resistor layer, the heating portion, or the like, by the plasma CVD method.

An SiN-based insulating film formed by using the Cat-CVD method has a density higher than that of an Si-based insulating film formed by using the plasma CVD method, and has high ink resistance and excellent cavitation property. On the other hand, the Si-based insulating film formed by the plasma CVD method deteriorates in terms of denseness as compared with the SiN-based insulating film formed by the Cat-CVD method, but is softer than the SiN film formed by the Cat-CVD method. For this reason, a silicon nitride film obtained by using the plasma CVD method which is a film softer than the silicon nitride film formed by the Cat-CVD method is formed, thereby suppressing generation of cracking. The SiN film obtained by the Cat-CVD method is formed under a condition that steepness of the step portion was improved (smoothed) by providing the protective layer formed by the plasma CVD method. Therefore, in the SiN film obtained by the Cat-CVD method, generation of stress concentration in the step portion can be reduced to a large extent.

Further, the protective film obtained by the Cat-CVD method is a film having a density higher than that of the conventional protective film, and has cavitation resistance. Accordingly, it is also possible that an upper portion protective film formed of a metal film such as Ta is not further formed on the protective film.

In addition, it is possible to make thinner the thickness of the protective film covering the heating portion 1104*a*, and to obtain excellent heat conductivity.

High heat conductivity to ink is required in order to discharge ink by utilizing heat energy regardless as to whether the film is directly in contact with the ink or not, which imposes a large restriction on the protective film as compared with a general protective film of a device in the semiconductor field. Therefore, design of a film in terms of ink resistance and energy efficiency is required.

The SiN film having a thickness Tpa (nm) and formed by using the plasma CVD method is a film provided for the purpose of reducing the steepness of the step portion of the wiring and preventing the cracking of the protective insulating film by the stress of the step portion. Assuming that the layer thickness (film thickness) of the heating resistor layer is set as The (nm) and the film thickness of the wiring is set as Tw (nm), within the range of the layer structure of the ink jet head, it is desirable that $100+(The+Tw)/3 \geqq Tps \geqq (The+Tw)/3$ is satisfied according to the empirical knowledge obtained from experimental data. That is, if the protective film has at least a thickness of one-third or larger of the total layer thickness of The (nm) of the heating resistor layer and the film thickness Tw (nm) of the wiring, the stress on the step portion can be reduced. An upper limit of the thickness of the protective layer is restricted by a value of the total thickness of the film thickness Tps (nm) of the SiN film formed by using the plasma CVD method and the film thickness Tct (nm) of the SiN film formed by using the Cat-CVD method. When the total thickness of those films becomes larger, the discharge drive voltage also becomes larger, which is because there is a constant restriction on a drive voltage that can be applied. In the film formation by the Cat-CVD method, the magnitude of the film stress can be controlled according to the film formation conditions, and excellent ink resistance and cavitation resistance are obtained. Considering the above-mentioned fact, it is desirable that the film thickness Tct of the SiN film formed by using the Cat-CVD method is made thicker, so a value of Tct is desirably set to about (The+Tw)/2 (nm).

The SiN film formed by using the Cat-CVD method has a durability about eight times as much as that of the SiN film formed by using the plasma CVD method, so the thickness thereof is desirably 50 nm or larger, and more desirably 70 nm or larger. The upper limit of the magnitude of the film thickness is not particularly restricted, but is determined by the upper limit of the magnitude of the film thickness of the insulating protective film which is determined by the magnitude of the drive voltage to be applied. In addition, the film stress is desirably 500 MPa or smaller.

The Si-based insulating film formed using the plasma CVD method may be formed of an SiN film, an $SiO_x$ film, or a laminated structure of an $SiO_x$ film and an SiN film or an SiON film.

Example 3-1

Hereinafter, Example 3-1 will be described in detail with reference to the drawings.

An ink jet head substrate 1100 according to this example has the same layer structure as that of the above-mentioned FIG. 9, so detailed description thereof will be omitted. In addition, a method of manufacturing the ink jet head substrate is also similar to that of the above-mentioned embodiment except a method of forming the protective layer, so detailed description thereof will be omitted.

In this example, an SiN film with a thickness of 150 nm serving as the first protective film 1106*a* was formed by using the plasma CVD method. As film formation conditions, an $SiH_4$ gas and an $NH_3$ gas were used as source gases, the substrate temperature was set to 400° C., and the pressure inside the deposition chamber 301 at the time of film formation was set to 0.5 Pa.

Then, an SiN film with a thickness of 250 nm serving as the second protective film 1106*b* was formed by using the Cat-CVD method, and patterning was performed to thereby obtain the ink jet head substrate 1100 shown in FIG. 9.

Figure 6:
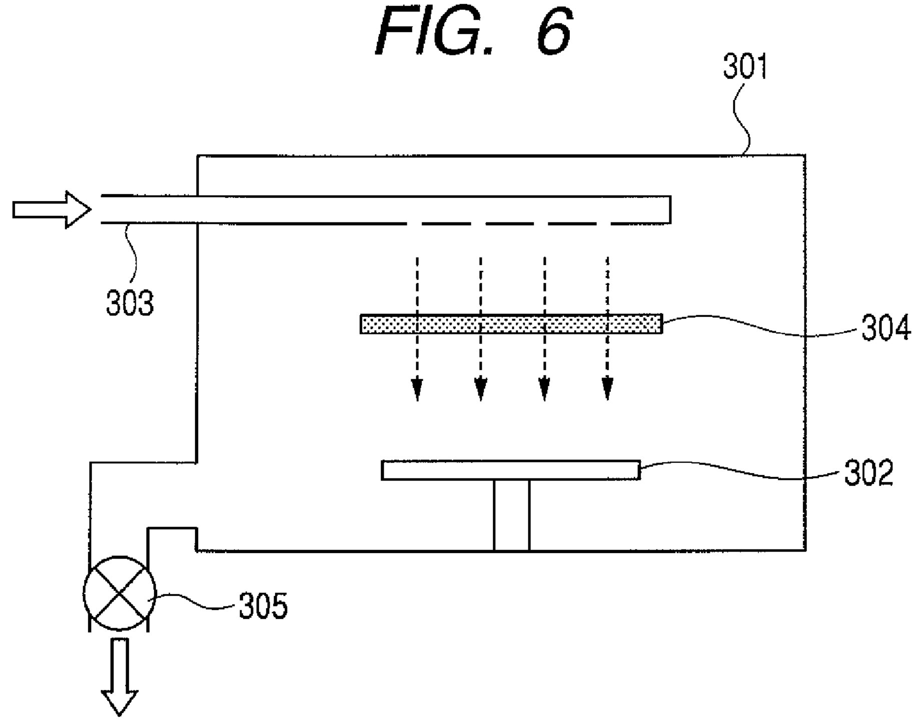
FIG. 6 is a schematic diagram of a film forming apparatus for forming a protective layer according to the example of the present invention.

In this example, the film formation using the apparatus shown in FIG. 6 was performed in the same manner as in the various film formation conditions described in Example 1-1 of the first embodiment.

Further, the ink jet head using the ink jet head substrate 1100 is the same as that of the ink jet head shown in FIG. 4 according to Example 1-1 of the first embodiment, so detailed description thereof will be omitted.

A method of producing the ink jet head of this example is the same as that described with reference to the schematic cross-sectional process diagrams of FIGS. 5A to 5D according to Example 1-1 of the first embodiment. Accordingly, detailed description thereof will be omitted.

The ink jet cartridge (FIG. 7) having a mode of the cartridge in which the ink jet head and the ink tank are integrated with each other, and the ink jet recording apparatus (FIG. 8) using the ink jet cartridge are the same as those described in Example 1-1 of the first embodiment. Accordingly, detailed description thereof will be omitted.

Example 3-2

In an ink jet head substrate 1100 of Example 3-2, unlike FIG. 9, as shown in FIG. J10, the first protective layer 1106*a* and the second protective layer 1106 are formed in the stated order, and then the upper portion protective layer 1107 is formed on the second protective layer 1106*b*.

In the same manner as in Example 3-1, on the first protective layer 1106*a* with a thickness of 200 nm formed of an SiN film formed by the plasma CVD method, the second protective layer 1106*b* formed of the SiN film was formed by the Cat-CVD method. As film formation conditions, an $NH_3$ gas of 50 sccm, an $SiH_4$ gas of 5 sccm, and an $H_2$ gas of 100 sccm were used, the pressure inside the deposition chamber 301 at the time of film formation was set to 10 Pa, the temperature of the heater 304 was set to 1700° C., and the substrate temperature was set to 350° C. At this time, the film stress was 50 nm and the film stress was 150 MPa (tensile stress).

Finally, a Ta film serving as the upper portion protective layer 1107 with a thickness of 100 nm was formed by the sputtering method, and patterning was performed to thereby obtain the ink jet head substrate 1100 shown in FIG. 10.

The upper portion protective layer 1107 formed of a Ta film has higher heat conductivity than the first protective layer 1106*a* and the second protective layer 1106*b*, which does not lower thermal efficiency to a large extent. The upper portion protective layer 1107 was formed directly on the dense first protective layer 1106*b*, so the upper portion protective layer 1107 could transfer the heat energy from the heating portion 1104*a* through the heat acting portion 1108 with efficiency to ink (liquid) provided thereon.

Example 3-3

An ink jet head substrate 1100 of an example of the present invention has the same layer structure as that of Example 3-1, and the first protective layer 1106*a* and the second protective layer 1106*b* are formed therein.

First, as the first protective layer 1106*a*, an SiO film with a thickness of 200 nm was formed by the plasma CVD method. Next, on the first protective layer 1106*a*, the second protective layer 1106*b* formed of an SiN film was formed by the Cat-CVD method. As film formation conditions, an $NH_3$ gas of 50 sccm, an $SiH_4$ gas of 5 sccm, and an $H_2$ gas of 100 sccm were used, the pressure inside the deposition chamber 301 at the time of film formation was set to 4 Pa, the temperature of the heater 304 was set to 1700° C., and the substrate temperature was set to 350° C. At this time, the film stress was 100 nm and the film stress was 500 MPa (tensile stress).

Example 3-4

In an ink jet head 1100 of an example of the present invention, on the first protective layer 1106*a* and the second protective layer 1106*b*, the third protective layer is further formed.

First, as the first protective layer 1106*a*, an SiO film with a thickness of 100 nm was formed by the plasma CVD method. Next, on the first protective layer 1106*a*, the second protective layer 1106*b* formed of an SiN film with a thickness of 100 nm was formed by the plasma CVD method.

Finally, on the second protective layer 1106*b*, the third protective layer formed of the SiN film was formed by the Cat-CVD method. As film formation conditions, an $NH_3$ gas of 50 sccm, an $SiH_4$ gas of 5 sccm, and an $H_2$ gas of 100 sccm were used, the pressure inside the deposition chamber 301 at the time of film formation was set to 4 Pa, the temperature of the heater 304 was set to 1700° C., and the substrate temperature was set to 100° C. At this time, the film stress was 80 nm and the film stress was 400 MPa (tensile stress).

Example 3-5

An ink jet head substrate 1100 of an example of the present invention has the same layer structure as that of the above-mentioned Example 3-2, and the first protective layer 1106*a*, the second protective layer 1106*b*, and the upper portion protective layer 1107 are formed therein.

As the first protective layer 1106*a*, an SiN film with a thickness of 300 nm was formed by the plasma CVD method. Then, on the first protective layer 1106*a*, the second protective layer 1106*b* formed of an SiN film was formed by the Cat-CVD method. As film formation conditions, an $NH_3$ gas of 50 sccm, an $SiH_4$ gas of 5 sccm, and an $H_2$ gas of 100 sccm were used, the pressure inside the deposition chamber 301 at the time of film formation was set to 10 Pa, the temperature of the heater 304 was set to 1700° C., and the substrate temperature was set to 350° C. At this time, the film stress was 200 nm and the film stress was 200 MPa (tensile stress).

Finally, a Ta film serving as the upper portion protective layer 1107 with a thickness of 100 nm was formed by the sputtering method.

Example 3-6

An ink jet head substrate 1100 of an example of the present invention has the same layer structure as that of the above-mentioned Example 3-1, and the first protective layer 1106*a* and the second protective layer 1106*b* are formed therein.

As the first protective layer 1106*a*, an SiO film with a thickness of 200 nm was formed by the plasma CVD method. Then, on the first protective layer 1106*a*, the second protective layer 1106*b* formed of an SiN film was formed by the Cat-CVD method. As film formation conditions, an $NH_3$ gas of sccm, an $SiH_4$ gas of 10 sccm, an $H_2$ gas of 400 sccm, and $O_2$ gas of 200 sccm were used, the pressure inside the deposition chamber 301 at the time of film formation was set to 20 Pa, the temperature of the heater 304 was set to 1700° C., and the substrate temperature was set to 300° C. At this time, the film stress was 100 nm and the film stress was 500 MPa (tensile stress).

Comparative Example 3-1

Except that the insulating protective layer was formed by using the plasma CVD method, the ink jet head substrate was produced in the same manner as in Example 3-1. As film formation conditions, an $SiH_4$ gas and an HN3 gas were used, the substrate temperature was set to 400° C., the pressure inside the deposition chamber at the time of film formation was set to 0.5 Pa, the film thickness was set to 250 nm, and the film stress was set to 900 MPa (compression stress).

(Evaluation of Ink Jet Head Substrate and Ink Jet Head)

(Evaluation Results of Ink Resistance)

Each of the ink jet head substrates according to Examples 3-1, 3-3, 3-4, and 3-6 and Comparative Example 3-1, in each of which the upper portion protective layer (Ta film) was not formed, was immersed in ink and was left in a temperature-controlled bath of 70° C. for three days. Then, a change in thickness of the insulating protective layer (protective film) after being immersed was observed in comparison with the layer thickness (film thickness) thereof before being immersed. In this case, since the SiN film and the SiON film are more liable to be etched in an alkaline liquid than acid, alkalescent ink of about pH 9 was used for the test of the ink resistance.

As a result, in the ink jet head substrate according to Comparative Example 3-1, the SiN film was reduced in thickness by about 80 nm as compared with the initial film thickness. In contrast, in the ink jet head substrate according to Examples 3-1, 3-3, 3-4, and 3-6 of this embodiment, the SiN film was reduced in thickness by only about 10 nm. From the results, it is found that the protective layers (protective films) of the examples that are formed by the Cat-CVD method has higher ink resistance.

In place of the conventional SiN film formed by the plasma CVD method and used as an insulating protective film, a film containing multiple insulating protective layers in which at least the insulating protective layer serving as the upper most layer was formed by the Cat-CVD method was used in the examples of this embodiment. It was found that the insulating protective film thus formed had excellent ink resistance. It was also found that the protective layer had high coverage without generating of cracking in the step portion of the film, or the like.

(Head Characteristics)

Next, each of the ink jet heads including the ink jet head substrates according to Examples 3-1 to 3-6 and Comparative Example 3-1 was mounted to the ink jet recording apparatus, and measurement of the foaming start voltage Vth for starting discharge of ink, and a recording durability test were carried out. This test was conducted by recording a general test pattern which is incorporated in the ink jet recording apparatus, on an A-4 sheet. At this time, a pulse signal having a drive frequency of 15 KHz and a drive pulse width of 1 μs were applied to thereby obtain the foaming start voltage Vth. The results are shown in Table 4.

TABLE 4

| | Plasma CVD SiO Film formation temperature (° C.) Film Thickness (nm) Stress (Mpa) | Plasma CVD SiN Film formation temperature (° C.) Film Thickness (nm) Stress (Mpa) | Cat-CVD SiON Film formation temperature (° C.) Film Thickness (nm) Stress (Mpa) | Cat-CVD SiN Film formation temperature (° C.) Film Thickness (nm) Stress (Mpa) | Ta Film Thickness (nm) | Film Thickness (nm) | Foaming Start Voltage Vth (V) | Drive Voltage Vop (V) |
|---|---|---|---|---|---|---|---|---|
| Example 3-1 | — | 400<br>150<br>−500 | — | 300<br>250<br>200 | — | 400 | 14.2 | 18.5 |
| Example 3-2 | — | 400<br>200<br>−700 | — | 350<br>50<br>150 | 100 | 250 + 100 | 16.4 | 21.3 |
| Example 3-3 | 200 | — | — | 350<br>100<br>500 | — | 300 | 15 | 19.5 |
| Example 3-4 | 100 | 400<br>100<br>−500 | — | 100<br>80<br>400 | — | 280 | 14.9 | 19.4 |
| Example 3-5 | — | 400<br>300<br>−900 | — | 300<br>200<br>200 | 100 | 500 + 100 | 18.5 | 24.1 |
| Example 3-6 | 200 | — | 300<br>100<br>500 | — | — | 300 | 14.7 | 19.1 |
| Comparative example 3-1 | — | 400<br>250<br>−900 | — | — | — | 250 | 15 | 19.5 |

In the structure shown in FIG. 9 in which the first protective layer 1106*a* was formed by the plasma CVD method and the second protective layer 1106*b* was formed by the Cat-CVD method, the foaming start voltage Vth was 14.2 V (Example 3-1). Also in the other examples, the same results were obtained. As apparent from Table 4, in each of the examples, the foaming start voltage Vth was reduced by about 5%, and improvement in power consumption was found. Note that in Example 3-5, the foaming start voltage Vth becomes higher because the first protective layer, the second protective layer, and the upper portion protective layer are formed with a total thickness of 600 nm which is thicker than that of the other examples. However, the thickness is within a range where discharge of ink can be actually driven, so Example 3-5 has a desirable structure for performing recording for a long period of time.

Then, assuming that a voltage 1.3 times as large as the Vth was set as the drive voltage Vop, recording of a standard document of 1500 words was performed. As a result, it was confirmed that each of the ink jet heads according to Examples 3-1 to 3-6 could perform recording of 5000 sheets or more of the document, and deterioration in recording quality was not found.

On the other hand, the ink jet head according to Comparative Example 3-1 could perform recording of about 1000 sheets of the document, but after that, the recording was impossible. By confirming the cause thereof, it was found that breaking of wirings occurred mainly due to cavitation and elution by ink in the insulating protective layer.

Specifically, it was found that the ink jet head according to this embodiment to which the protective layer (protective film) was applied could provide images stable for a long period of time and had excellent durability.

Fourth Embodiment

In an ink jet head substrate 1100 according to an embodiment of the present invention, multiple heating portions 1104*a* are formed on the substrate. Each of the heating portions 1104*a* is electrically connected to an external power source through an opening (through hole which penetrates protective layer) provided in the insulating protective layer which covers the heating resistor layer 1104. Specifically, the heating resistor layer 1104 is connected to a common wiring formed by a plating method in the opening formed in the insulating protective film and made of a metal such as gold and copper. In this embodiment, an insulating protective film which covers the common wiring of the liquid discharge head substrate (ink jet head substrate) is formed by using the Cat-CVD method under a condition that the substrate temperature is set to a room temperature or 50° C. to 200° C.

According to the Cat-CVD method, even when the film formation is performed by lowering the substrate temperature to a room temperature or 50° C. to 200° C., there is no possibility that the denseness or the coating property of the film is deteriorated. For this reason, even when an SiN-based insulating film is formed as a protective film for the substrate surface after the formation of the common wiring having a large thickness by the plating method using gold, copper, or the like, migration between adjacent wirings due to diffusion of metal materials such as gold by heat does not occur.

Example 4-1

Hereinafter, Example 4-1 will be described in detail with reference to the drawings.

An ink jet head substrate 1100 of this example has basically the same structure as that of the above-mentioned Example 1-1. This example relates to a configuration of a connection portion between the common wiring and the electrode wiring which is not described in the above-mentioned embodiments.

Figure 11:
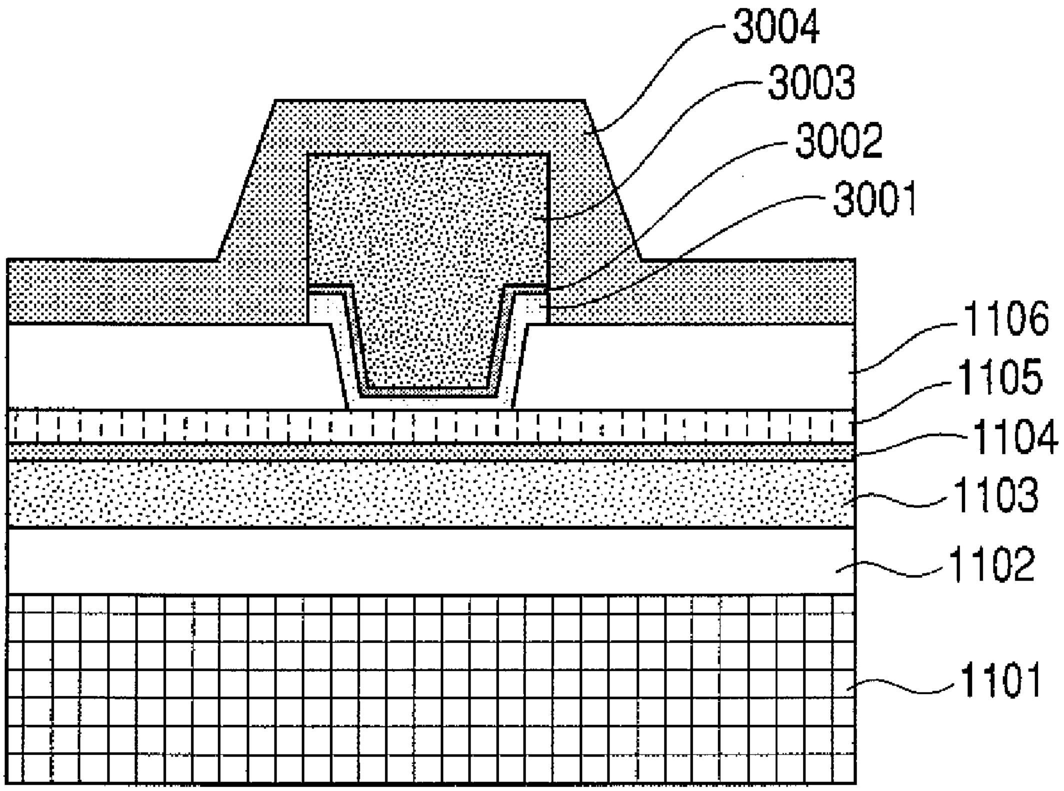
FIG. 11 is a schematic cross-sectional diagram illustrating a connection portion between a common wiring and an electrode wiring.

FIG. 11 is a schematic cross-sectional diagram illustrating the connection portion between the common wiring and the electrode wiring.

A surface of the electrode wiring layer 1105 which is formed on the heating resistor layer 1104 and is made of aluminum or an alloy mainly containing aluminum is coated with the protective layer 1106. On a side surface and a bottom surface of the through hole penetrating the protective layer 1106 formed on the electrode wiring 1105, and in a region in which the common wiring of the protective layer 1106 was formed, an adhesion-improving layer (barrier metal) 3001 made of TiW with a thickness of 200 nm was formed. After that, on the adhesion-improving layer 3001, a metal layer 3002 of a conductive material for plating made of gold with a thickness of 50 nm, and a plated wiring layer 3003 with a thickness of 5 μm constituting a common wiring were formed. After that, on the substrate, an insulating protective film 3004 formed of a silicon nitride film with a thickness of 300 nm formed by the Cat-CVD method was formed.

Next, with reference to manufacturing process cross-sectional diagrams of FIGS. 12A to 12G, a method of manufacturing a thick wiring by plating will be described.

Figure 12A:
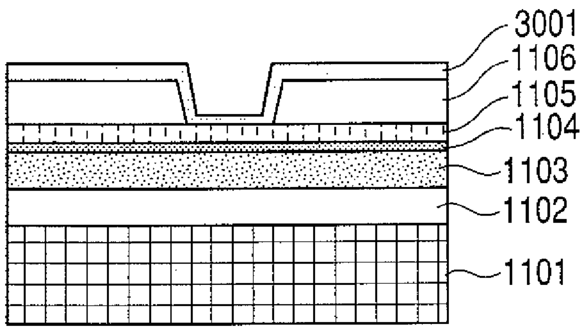
FIGS. 12A, 12B, 12C, 12D, 12E, 12F and 12G are process cross-sectional diagrams for schematically illustrating a method of manufacturing a thick film wiring by a plating method.
Figure 12B:
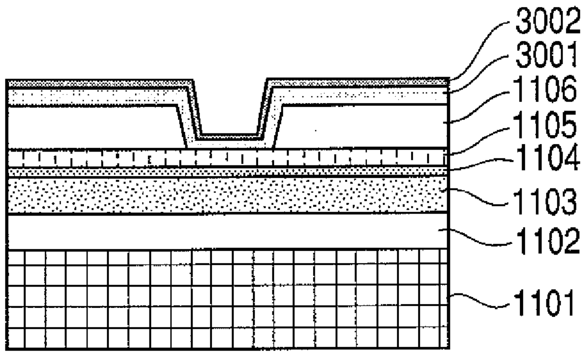

On the protective film 1106, using a normal photolithography method, a resist pattern (not shown) serving as an etching protective film for the protective film 1106 was formed. After that, an opening from which the electrode wiring 1105 was exposed was formed by using the normal dry etching method. Subsequently, the adhesion-improving layer (barrier metal) 3001 made of TiW, which is a high melting point metal material, or the like was formed with a thickness of 200 nm by sputtering (FIG. 12A).

Then, the gold layer 3002 of a conductive material for plating which is a metal for wiring was formed with a thickness of 50 nm by sputtering. In this example, gold was used as a conductive material.

Figure 12C:
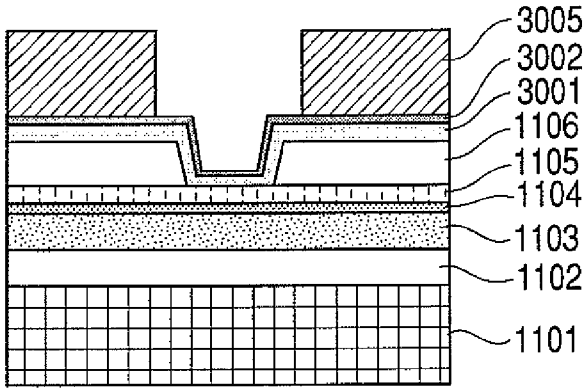

After that, onto the surface of the gold layer of a conductive material for plating, a photoresist 3005 was applied by spin-coating (FIG. 12C). At this time, the application of the photoresist was performed so as to obtain a thickness larger than a desired thickness of the common wiring. For example, in a case of obtaining a plating thickness of 5 μm, spin-coating was applied under a rotational speed condition for obtaining a photoresist film with a thickness of 6 μm.

Then, the resist exposure/development processing was performed by the photolithography method, and the photoresist 3005 was removed so that the metal of the conductive material for plating provided at a portion for forming the common wiring line was exposed, thereby forming a resist serving as a mold material for plating.

Figure 12D:
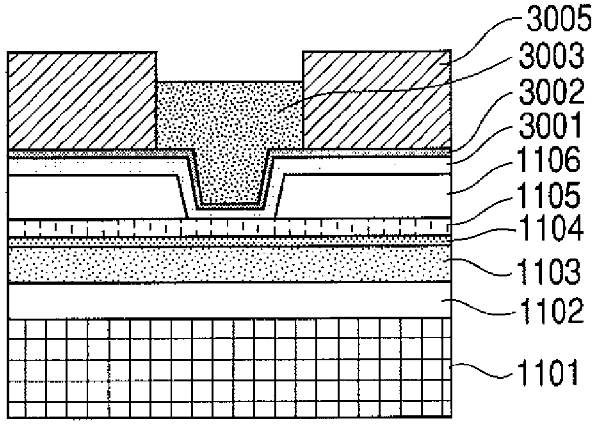

After that, a predetermined amount of current was caused to flow through the metal of the conductive material for plating in an elextrolytic bath containing gold sulfite salt by an electrolytic plating method. Then, the gold layer 3003 was deposited in a predetermined region which was not covered with the photoresist 3005 (FIG. 12D).

Figure 12E:
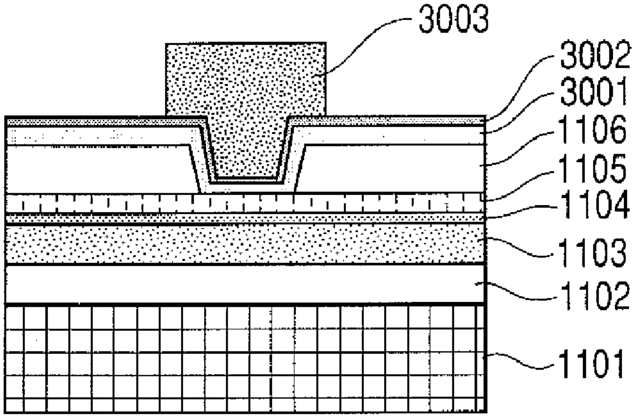
Figure 12F:
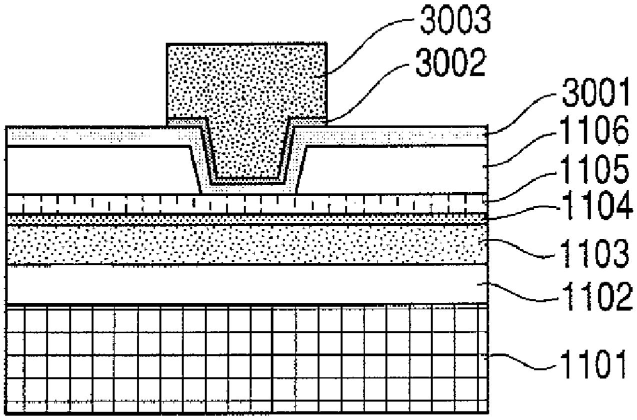

Then, the photoresist 3005 used for formation of the common wiring layer was removed by a resist remover (FIG. 12E). Thus, the adhesion-improving layer 3001 was exposed (FIG. 12F).

Figure 12G:
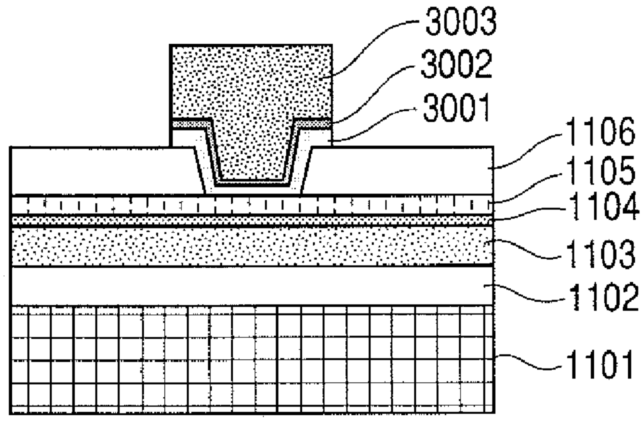
Figure 13:
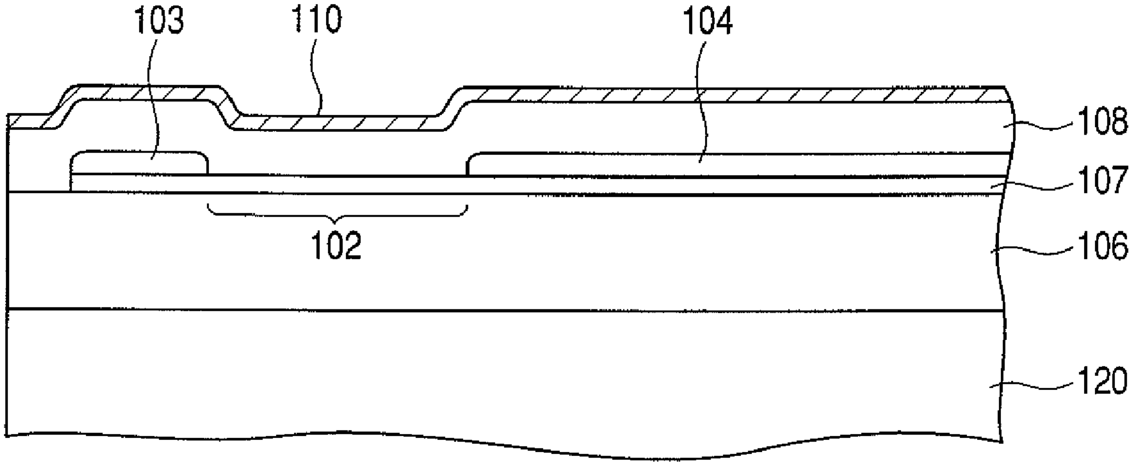
FIG. 13 is a cross-sectional diagram taken along the line II-II of a heating portion of a conventional ink jet substrate.

After that, the adhesion-improving layer 3001 was immersed for a predetermined period of time in an $H_2O_2$- based etchant. Thus, the exposed adhesion-improving layer 3001 made of a high melting point metal material was removed (FIG. 12G).

Then, the insulating protective film 3004 formed of an SiN film with a thickness of 300 nm was formed by using the Cat-CVD method. The film stress thereof was 200 Mpa (tensile stress).

In this case, the film formation by the Cat-CVD method was performed in the same manner as in the case of the above-mentioned apparatus shown in FIG. 6.

It should be noted that the ink jet head 1100 including the ink jet head substrate 1101 is the same as that described in the ink jet head shown in FIG. 4 according to Example 1-1 of the first embodiment, so detailed description thereof will be omitted.

Further, a method of producing the ink jet head is the same as that described with reference to the schematic process sectional diagrams of FIGS. 5A to 5D according to Example 1 of the first embodiment, so detailed description thereof will be omitted.

Further, the ink jet cartridge (FIG. 7) in a mode of a cartridge in which an ink jet head and an ink tank are integrated with each other, and the ink jet recording apparatus (FIG. 8) using the ink jet cartridge are the same as those described in Example 1-1 of the first embodiment. Accordingly, detailed description thereof will be omitted.

It should be noted that, in this example, the insulating protective film 1106 formed on the heating resistor layer 1104 is formed by the plasma CVD method, and the Ta film serving as the upper portion protective film is formed on the insulating protective film 1106. The insulating protective film 1106 is desirably an SiN film formed by using the Cat-CVD method as described in the first embodiment. In this case, the Ta film serving as the upper portion protective film may not be formed.

Comparative Example 4-1

Except that the insulating protective layer was formed by using the plasma CVD method, the ink jet head substrate was produced in the same manner as in Example 4-1. As film formation conditions, an $SiH_4$ gas and an $NH_3$ gas were used, the substrate temperature was set to 400° C., the pressure inside the deposition chamber at the time of film formation was set to 0.5 Pa, the film thickness was set to 1000 nm, and the film stress was −900 MPa (compression stress).

Example 4-2

In an example of the present invention, as in Example 4-1, the SiN film was formed by the Cat-CVD method. As film formation conditions, an $NH_3$ gas of 10 sccm, an $SiH_4$ gas of 5 sccm, and an $H_2$ gas of 20 sccm were used, the pressure inside the deposition chamber 301 was set to 5 Pa, the temperature of the heater 304 was set to 1700° C., and the substrate temperature was set to 50° C. At this time, the film thickness was set to 300 nm, and the film stress was 150 MPa (tensile stress).

After that, in the same manner as in Example 4-1, the ink jet head was produced.

(Evaluation of Ink Jet Head Substrate and Ink Jet Head)

In Examples 4-1 and 4-2, film formation was performed at a temperature as low as 200° C. or lower. As a result, a problem such as generation of a leak current between adjacent wirings due to migration caused by thermal diffusion of a metal formed by the plating method.

On the other hand, the insulating protective film obtained by the plasma CVD method which was formed in Comparative Example 4-1 was formed at a temperature as high as 400° C. As a result, leakage of a current was generated between the adjacent wirings due to the migration caused by thermal diffusion of a metal. In the case of the ink jet head according to Comparative Example 4-1, there arose a problem of lowering the pressure resistance of a drive element mounted, which led to a reduction in yield.

As a result, according to the examples of this embodiment, as compared with the film formation by the plasma CVD method of Example 4-1 in which film formation was performed at high temperature, a more reliable ink jet head having a smaller leak current between wirings and larger pressure resistance could be obtained.

It should be noted that the formation of the protective film by the Cat-CVD method was performed at a low temperature which is equal to or lower than 200° C., or the room temperature or higher, which did not raise any problem in ink resistance.

Fifth Embodiment

In a case of forming a semiconductor element for driving an ink jet head on a silicon substrate, in order to stabilize the characteristics of the semiconductor element, hydrogen treatment is performed. Specifically, hydrogen treatment in which the treatment is performed in a diffusion furnace or the like at a temperature of about 350° C. to 450° C. in hydrogen atmosphere is performed. The hydrogen treatment is a treatment for exposing the silicon substrate with an inside of the diffusion furnace at the temperature of about 350° C. to 450° C. being the hydrogen atmosphere, after the formation of the SiN film serving as a surface protective film. By the treatment, the adhesion among the aluminum-based metal wiring, the silicon substrate, and the insulating film can be enhanced.

The upper limit temperature in the hydrogen treatment is desirably 450° C. or lower at which diffusion of boron that is a p-type impurity is not caused. In order to bond a dangling bond of each of silicon atoms that constitute the silicon substrate, to hydrogen, a predetermined energy is required. Accordingly, the hydrogen treatment requires a heat treatment at a temperature of 350° C. or higher.

In general, the hydrogen treatment is performed such that, after the formation of the SiN film serving as the protective film, the substrate is transferred from the deposition chamber to the diffusion furnace to be subjected to batch processing. Specifically, the hydrogen treatment was not performed in a series of steps, but was required to be performed as another step. As a result, a time for production of the ink jet head substrate is required, which unavoidably led to disadvantage in costs.

In a case of using the conventional plasma CVD method, the hillock occurs due to the damage of the surface of the wiring using an aluminum-based metal by plasma and the damage thereof by high substrate temperature.

On the other hand, in the case of Cat-CVD method, the surface of the aluminum wiring is not damaged by plasma, so the hillock does not occur on the surface of the aluminum wiring even when the film growth is advanced at the substrate temperature of 350° C. to 400° C. For this reason, the protective film can be formed with a reduced thickness.

In this embodiment, by using an $SiH_4$ gas and an $NH_3$ gas as source gases, and using an $H_2$ gas as a diluent gas, the insulating protective film formed of an SiN film with a thickness of 100 nm to 500 nm was formed by the Cat-CVD method. A growth time for the SiN film at this time was 30 minutes to 1 hour.

Thus, at the substrate temperature of 350° C. to 400° C., the protective layer formed of an SiN film or the like was formed while diluting the atmosphere with an $H_2$ gas, so the hydrogen treatment of the silicon substrate can be performed at the same time.

In a case of using a wiring made of Au, Cu, or the like having a melting point higher than that of an aluminum-based metal, it is possible to perform the hydrogen treatment on the substrate by setting the substrate temperature higher than the above-mentioned substrate temperature. The substrate temperature is not limited to the above-mentioned substrate temperature.

Hereinafter, the present invention will be described in detail with reference to the drawings. Note that the present invention is not limited to the embodiments described below, but any structure may be appropriately adopted within a scope of claims as long as the objects of the present invention can be attained as a matter of course.

A method of manufacturing the ink jet head substrate according to this embodiment is the same as, for example, that described in the first embodiment. Both cases are different in settings of the substrate temperature when the protective layer is formed by the Cat-CVD method or in that an $H_2$ gas is used as a diluent gas in this embodiment.

Hereinafter, formation of an insulating protective layer according to this embodiment using the Cat-CVD apparatus shown in FIG. 6 will be described.

An SiN film serving as the insulating protective layer (film) which is formed by the Cat-CVD method has a thickness of 250 nm, and is desirably 100 nm or larger and 500 nm or smaller, and more desirably 150 nm or larger and 300 nm or smaller.

The film stress is desirably set in a range where generation of cracking due to the stress or deformation of the substrate do not occur. For example, the film stress is desirably set in a range from 500 MPa (tensile stress) to −500 MPa (compression stress).

The Cat-CVD method, as described above, utilizing catalytic reaction of a source gas caused on the surface of the heater 304, originally enables film formation by lowering the substrate temperature. However, in this embodiment, the formation of the insulating protective layer and the hydrogen treatment were performed at the same time, the substrate temperature was controlled to be 350° C. to 400° C.

First, the chamber 301 was reduced in pressure by exhausting air using the exhaust pump 305 until a pressure inside thereof becomes $1\times10^{-5}$ Pa to $1\times10^{-6}$ Pa. Then, an $H_2$ gas of 100 sccm and an $NH_3$ gas of 50 sccm were introduced into the deposition chamber 301 from a gas inlet. At this time, a heater for adjusting the substrate temperature was adjusted to obtain the substrate temperature of 400° C. Then, an external power source was adjusted to heat up the temperature of the heater 304 serving as a heating catalytic member to 1700° C. Then, an $SiH_4$ gas of 10 sccm was introduced into the chamber 301, and an SiN film was formed by catalyzed degradation of the $NH_3$ gas and the $SiH_4$ gas.

The film formation time was about 30 minutes and the film stress was 200 MPa (tensile stress). At this time, the pressure inside the deposition chamber 301 was 5 Pa.

In the Cat-CVD method, in a case of using a hydrogen gas as a diluent gas, by setting the substrate temperature to 350° C. or higher, and setting the growth time to 30 minutes or more, it is possible to perform conventional hydrogen annealing and protective film growth by the Cat-CVD method at the same time.

The upper limit of the substrate temperature can be selected from a range where an impurity diffused in a drain/source region of a transistor device is diffused at the substrate temperature in a case of growing the protective film and the characteristics of the impurity are not changed. On the other hand, a stress between the substrate and the protective film is increased by increasing the film formation temperature. Accordingly, in order to prevent the increase of the stress, the upper limit of the substrate temperature is desirably 450° C. or lower, and more desirably 400° C. or lower.

As described above, the formation of the insulating protective layer and the hydrogen annealing treatment were performed at the same time.

Finally, the Ta film 1107 serving as the upper portion protective layer was formed with a thickness of 200 nm by the sputtering method.

The ink jet head 1100 including the ink jet head substrate 1101 is the same as that described in the case of the ink jet head shown in FIG. 4 of Example 1-1 of the first embodiment, so description thereof will be omitted.

A method of producing the ink jet head is the same as that described with reference to the schematic cross-sectional process diagrams of FIGS. 5A to 5D according to Example 1-1 of the first embodiment. Accordingly, detailed description thereof will be omitted.

Further, the ink jet cartridge (FIG. 7) having a mode of the cartridge in which the ink jet head and the ink tank are integrated with each other, and the ink jet recording apparatus (FIG. 8) using the ink jet cartridge are the same as those described in Example 1-1 of the first embodiment. Accordingly, detailed description thereof will be omitted.

Example 5-1

Using the above-mentioned manufacturing method, the ink jet head substrate described below was manufactured.

As a film structure, first, the heat accumulation layer 1102 (thermal oxide film) of 1.8 μm, the interlayer film 1103 (SiO film by CVD) of 1.0 μm, the heating resistor layer 1104 (TaSiN film) of 40 nm, and the electrode wiring layer 1105 (Al) of 400 nm were respectively formed. After that, the insulating protective film 1106 (SiN film by Cat-CVD) of 250 nm and the upper portion protective layer 1107 (Ta) of 200 nm were respectively formed.

Example 5-2

In an example of the present invention, as in Example 5-1, an SiN film was formed by using the Cat-CVD method. Film formation was performed for 40 minutes under conditions that an $NH_3$ gas of 60 sccm, an $SiH_4$ gas of 8 sccm, and an $H_2$ gas of 80 sccm were used, the pressure inside the deposition chamber 301 at the time of film formation was set to 4 Pa, the temperature of the heater 304 was set to 1700° C., and the substrate temperature was set to 380° C. At this time, the film stress was 150 MPa (tensile stress).

In Example 5-1, a Ta film was formed as the upper portion protective layer 1107. While, this example has a structure in which the upper protective layer shown in FIG. 3 is not provided.

Example 5-3

In an example of the present invention, as in the structure shown in FIG. 9, the SiN film was formed by changing the composition thereof in the film thickness direction. The SiN film was formed such that a side thereof closer to ink had a composition containing more Si than a side thereof in contact with the heating resistor layer 1104. Specifically, setting was performed such that the flow rate of the $SiH_4$ gas increases toward the side closer to the ink from the side in contact with the heating resistor layer 1104.

First, film formation was started under conditions that an $H_2$ gas of 120 sccm, an $NH_3$ gas of sccm, and an $SiH_4$ gas of 5 sccm were used, the pressure inside the deposition chamber 301 was set to 5 Pa, the temperature of the heater 304 was set to 1800° C., and the substrate temperature was set to 390° C. After that, by increasing $SiH_4$ gas flow rate gradually to 6 sccm and to 7 sccm, an SiN film with a thickness of 300 nm was formed. The whole film formation time was 40 minutes. At this time, the film stress was −150 MPa (compression stress).

Except for the above-mentioned conditions, the ink jet head substrate was produced in the same manner as in Example 5-2.

Example 5-4

In an example of the present invention, as in Example 5-2, the SiN film was formed by using the Cat-CVD method. Film formation was performed for 60 minutes under conditions that an $NH_3$ gas of 60 sccm, an $SiH_4$ gas of 8 sccm, and an $H_2$ gas of 80 sccm were used, the pressure inside the deposition chamber 301 at the time of film formation was set to 2 Pa, the temperature of the heater 304 was set to 1700° C., and the substrate temperature was set to 380° C. At this time, the film thickness was 250 nm and the film stress was 160 MPa (tensile stress).

Example 5-5

In an example of the present invention, as in Example 5-2, the SiN film was formed by using the Cat-CVD method. Film formation was performed for 40 minutes under conditions that an $NH_3$ gas of 60 sccm, an $SiH_4$ gas of 8 sccm, and an $H_2$ gas of 80 sccm were used, the pressure inside the deposition chamber 301 at the time of film formation was set to 4 Pa, the temperature of the heater 304 was set to 1700° C., and the substrate temperature was set to 350° C. At this time, the film thickness was 250 nm and the film stress was 150 MPa (tensile stress).

Example 5-6

In an example of the present invention, as in Example 5-2, the SiN film was formed by using the Cat-CVD method. Film formation was performed for 15 minutes under conditions that an $NH_3$ gas of sccm, an $SiH_4$ gas of 10 sccm, and an $H_2$ gas of 100 sccm were used, the pressure inside the deposition chamber 301 at the time of film formation was set to 5 Pa, the temperature of the heater 304 was set to 1700° C., and the substrate temperature was set to 400° C. At this time, the film thickness was 100 nm and the film stress was 220 MPa (tensile stress).

Example 5-7

In an example of the present invention, as in Example 5-2, the SiN film was formed by using the Cat-CVD method. Film formation was performed for 60 minutes under conditions that an $NH_3$ gas of 50 sccm, an $SiH_4$ gas of 10 sccm, and an H2 gas of 100 sccm were used, the pressure inside the deposition chamber 301 at the time of film formation was set to 5 Pa, the temperature of the heater 304 was set to 1700° C., and the substrate temperature was set to 400° C. At this time, the film thickness was 500 nm and the film stress was 300 MPa (tensile stress).

(Prior Art)

An ink jet head substrate conventionally manufactured was produced under the following film formation conditions.

The first protective layer is formed of a PSG film with a thickness of 700 nm formed by using the plasma CVD method. The second protective layer is formed of a silicon oxide film with a thickness of 300 nm formed by using the plasma CVD method. The upper protective layer is a Ta film with a thickness of 250 nm formed by using the sputtering method. Then, those films were formed in the stated order to form the ink jet head substrate. The film stress of the second protective film was 900 Pa (tensile stress).

Comparative Example 5-1

According to a comparative example of the present invention, an ink jet head substrate was formed in the same manner as in Example 5-2 except that the insulating protective layer was formed by using the plasma CVD method. As film formation conditions, an $SiH_4$ gas of 200 sccm and an $NH_3$ gas of 1500 sccm were used, the pressure inside the deposition chamber at the time of film formation was 0.5 Pa, and the substrate temperature was 400° C. At this time, the film thickness was 250 nm, and the film stress was −900 MPa (compression stress).

In this comparative example, the ink jet head substrate having the insulating protective film formed therein was set in a heating furnace, thereby performing hydrogen treatment with the atmosphere inside the furnace having a mixture gas of an $H_2$ gas and an $N_2$ gas. The substrate temperature of this case was 400° C. and the processing time was 30 minutes.

Comparative Example 5-2

According to a comparative example of the present invention, similar to Example 5-2, a Ta film serving as the upper portion protective film was not formed and an SiN film was formed by using the Cat-CVD method. This comparative example is different from Example 5-2 in that the formation of the protective layer by the Cat-CVD method and the hydrogen treatment are performed at the same time in Example 5-2, while the hydrogen treatment is performed as another step after the formation of the protective layer by the Cat-CVD method in this comparative example.

As film formation conditions, an $NH_3$ gas of sccm, an $SiH_4$ gas of 10 sccm, an $H_2$ gas of 400 sccm, and an $O_2$ gas of 200 sccm were used, the pressure inside the deposition chamber 301 at the time of film formation was set to 20 Pa, the temperature of the heater 304 was set to 1750° C., and the substrate temperature was set to 100° C. Thus, the SiN film with a thickness of 300 nm was formed. The film formation time was 80 minutes and the film stress was 500 MPa (tensile stress).

After that, in the same manner as in Comparative Example 5-1, the hydrogen treatment was performed for 30 minutes at the substrate temperature of 400° C. in the mixture gas of an $H_2$ gas and $N_2$ gas.

Comparative Example 5-3

According to a comparative example of the present invention, similar to Example 5-2, an SiN film was formed by using the Cat-CVD method. This comparative example is different from Example 5-2 in that the formation of the protective layer by the Cat-CVD method and the hydrogen treatment are performed at the same time in Example 5-2, while the hydrogen treatment is performed as another step after the formation of the protective layer by the Cat-CVD method in this comparative example.

As film formation conditions, an $NH_3$ gas of 60 sccm, an $SiH_4$ gas of 5 sccm, and an $H_2$ gas of 80 sccm were used, the pressure inside the deposition chamber 301 at the time of film formation was set to 4 Pa, the temperature of the heater 304 was set to 1700° C., and the substrate temperature was set to 300° C. Thus, the SiN film with a thickness of 250 nm was formed. The film formation time was 40 minutes. The film thickness of the SiN film was 250 nm, and the film stress was 150 MPa (tensile stress).

After that, in the same manner as in Comparative Example 5-1, the hydrogen treatment was performed for 30 minutes at the substrate temperature of 400° C. in the mixture gas of an $H_2$ gas and $N_2$ gas.

(Evaluation of Ink Jet Head Substrate and Ink Jet Head)

(Evaluation Results of Ink Resistance)

The SiN film and the SiON film are more liable to be etched in an alkaline liquid than in acid, so the test of the ink resistance was performed using alkalescent ink of about pH 9.

Each of the ink jet head substrates according to Example 5-2 to 5-7, and Comparative Example 5-1 to 5-3, in which the upper portion protective layer (Ta film) was not formed, was immersed in ink and was left in a temperature-controlled bath of 70° C. for three days. Then, a change in thickness of the insulating protective layer after being immersed was observed in comparison with the layer thickness (film thickness) thereof before being immersed.

As a result, in the ink jet head substrate according to Comparative Examples 5-1, the SiN film was reduced in thickness by about 80 nm. In contrast, in the ink jet head substrates according to Examples 5-2 to 5-7 and Comparative Examples 5-2 and 5-3, the SiN film was reduced in thickness by only about 10 nm.

It was found that, as compared with the conventional SiN film formed by the plasma CVD method and used as an insulating protective film, the film formed by the Cat-CVD method as in the examples of this embodiment had an excellent ink resistance. For this reason, even when the protective layer is thinned, the required protection performance can be obtained, which can make the film thinner than the conventional case. As a result, it was found that a layer structure having a high energy efficiency could be obtained.

In addition, as apparent from the results, also in Comparative Examples 5-2 and 5-3, even when the hydrogen treatment was performed as another step after the formation of the protective layer by the Cat-CVD method, desirable results could be obtained. However, the formation of the protective layer by the Cat-CVD method and the hydrogen treatment were performed at the same time as in this example, to thereby achieve reduction in time and simplification of the production.

TABLE 5

| | First Protective Layer nm | Second Protective Layer nm Substrate Temperature (° C.) Film formation time (min.) | Upper Portion Protective Layer nm | Etching-resistive Property nm | Stress MPa | Hydrogen Treatment | Ink resistance |
|---|---|---|---|---|---|---|---|
| Example 5-1 | None | 250 SiN CatCVD 400 30 | 200 Ta Sputtering | – | 200 | None | ○ |
| Example 5-2 | None | 250 SiN CatCVD 380 40 | None | 10 | 150 | None | ○ |
| Example 5-3 | None | 300 SiN CatCVD 390 40 | None | 10 | −150 | None | ○ |
| Example 5-4 | None | 250 SiN CatCVD 380 60 | None | 10 | 160 | None | ○ |
| Example 5-5 | None | 250 SiN CatCVD 350 40 | None | 10 | 150 | None | ○ |
| Example 5-6 | None | 100 SiN CatCVD 400 40 | None | 10 | 220 | None | ○ |

TABLE 5-continued

| | First Protective Layer nm | Second Protective Layer nm Substrate Temperature (° C.) Film formation time (min.) | Upper Portion Protective Layer nm | Etching-resistive Property nm | Stress MPa | Hydrogen Treatment | Ink resistance |
|---|---|---|---|---|---|---|---|
| Example 5-7 | None | 500 SiN CatCVD 400 60 | None | 10 | 300 | None | ○ |
| Prior Art | 700 PSG Plasma CVD | 300 SiN Plasma CVD | 250 Ta Sputtering | — | 900 | Present | ○ |
| Comparative example 5-1 | None | 250 SiN Plasma CVD | None | 80 | −900 | Present | X |
| Comparative example 5-2 | None | 300 SiN CatCVD 100 80 | None | 10 | 500 | Present | ○ |
| Comparative example 5-3 | None | 250 SiN CatCVD 300 40 | None | 10 | 150 | Present | ○ |

(Head Characteristics)

Next, each of the ink jet heads including the ink jet head substrates according to the examples and the comparative examples of this embodiment was mounted to the ink jet recording apparatus, and measurement of the foaming start voltage Vth for starting discharge of ink, and a recording durability test were carried out. This test was conducted by recording a general test pattern which is incorporated in the ink jet recording apparatus, on an A-4 sheet. At this time, a pulse signal having a drive frequency of 15 KHz and a drive pulse width of 1 μs were applied to thereby obtain the foaming start voltage Vth. The results are shown in Table 6.

TABLE 6

| | Foaming Start Voltage Vth [V] | Drive Voltage Vop [V] |
|---|---|---|
| Example 5-1 | 18.0 | 23.4 |
| Example 5-2 | 14.5 | 18.9 |
| Example 5-3 | 14.6 | 19.0 |
| Example 5-4 | 14.5 | 18.9 |
| Example 5-5 | 14.6 | 19.0 |
| Example 5-6 | 12.9 | 16.8 |
| Example 5-7 | 15.6 | 20.3 |
| Comparative example 5-1 | 15.0 | 19.5 |
| Comparative example 5-2 | 14.7 | 19.1 |
| Comparative example 5-3 | 14.5 | 18.9 |

In the structure of FIG. 2 in which the insulating protective layer was formed by the Cat-CVD method and the upper portion protective layer with a film thickness of 200 nm was formed, the foaming start voltage Vth was 18.0 V (Comparative Example 5-1).

Further, as illustrated in FIG. 3, in Examples 5-2 to 5-7 in which the insulating protective layer was in contact with ink without forming the upper portion protective layer, it was found that the foaming start voltage Vth was reduced by about 10 to 15% and improvement in power consumption was found as apparent from the results shown in Table 6.

It should be noted that in Example 5-7, the foaming start voltage Vth becomes higher since the protective layer has a film thickness as thick as 500 nm. However, the thickness is within a range where discharge of ink can be actually driven, so Example 5-7 has a desirable structure for performing recording for a long period of time.

In addition, in Examples 5-1 to 5-7 of this embodiment including Example 5-3 in which the composition of the insulating protective film in the film thickness direction was changed, no particular abnormality was seen in the drive of the head as compared with the comparative examples.

Further, as in Comparative Examples 5-2 and 5-3, there was no difference between the case where the hydrogen treatment was performed after the formation of the insulating protective layer, and the case where the formation of the insulating protective layer and the hydrogen treatment were performed at the same time as in this embodiment. This shows that, also in the manufacturing method according to this embodiment, the hydrogen treatment is performed as effectively as in the conventional case.

Then, assuming that a voltage 1.3 times as large as the Vth was set as the drive voltage Vop, recording of a standard document of 1500 words was performed. As a result, it was confirmed that each of the ink jet heads according to Examples 5-1 to 5-7 and Comparative Examples 5-2 and 5-3 could perform recording of 5000 sheets or more of the document, and deterioration in recording quality was not found.

On the other hand, the ink jet head according to Comparative Example 5-1 could perform recording of about 1000 sheets of the document, but after that, the recording was impossible. By confirming the cause thereof, it was found that breaking of wirings occurred mainly due to cavitation and elution by ink in the insulating protective layer.

Specifically, it was found that, in both the example in which the substrate temperature condition by the Cat-CVD method was increased to 350° C. to 400° C. so as to perform the hydrogen annealing at the same time, and the comparative example in which the film formation was performed at the substrate temperature of 100° C. to 300° C. which was relatively low temperature, it was possible to provide images stable for a long period of time and obtain excellent durability.

This is because, even when the substrate temperature condition by the Cat-CVD method was increased to 350° C. to 400° C. so as to perform the hydrogen annealing at the same time, the hillock does not occur on the surface of the aluminum-based wiring, and even when the insulating protective layer is made thinner, a pin-hole does not generate in the insulating protective film.

This application claims the benefit of Japanese Patent Application No. 2006-026019 filed on Feb. 2, 2006, Japanese Patent Application No. 2006-065815 filed on Mar. 10, 2006, Japanese Patent Application No. 2006-070818 filed on Mar. 15, 2006, Japanese Patent Application No. 2006-131415 filed on May 10, 2006, and Japanese Patent Application No. 2006-325987 filed on Dec. 1, 2006, which are hereby incorporated by reference herein in their entirety.

The invention claimed is:

1. A method of manufacturing a liquid discharge head substrate, the liquid discharge head substrate comprising:

a substrate;

a heating resistor layer formed on the substrate;

a flow path for a liquid;

a conductive layer stacked on the heating resistor layer and having an end portion which forms a step portion on the heating resistor layer; and a protective layer covering the heating resistor layer and the conductive layer including the step portion, and formed between the heating resistor layer and the flow path, the protective layer being provided by stacking a plurality of layers, the method comprising forming a first layer of the plurality of layers which is closest to the heating resistor layer by a plasma CVD method and a second layer of the plurality of layers which is furthest from the heating resistor layer by supplying at least a gas containing silicon and a gas containing nitrogen at a substrate temperature of 50° C. to 400° C. by a Cat-CVD method.

2. A method of manufacturing a liquid discharge head, comprising providing a flow path forming member having a discharge port for discharging a liquid, to a substrate manufactured by the method of manufacturing a liquid discharge head substrate according to claim 1.

3. The method of manufacturing a liquid discharge head substrate according to claim 1, wherein the first layer is more flexible than the second layer.

4. The method of manufacturing a liquid discharge head substrate according to claim 1, wherein the first layer is an SiN film, an $SiO_x$ film, or a laminated structure of an $SiO_x$ film and an SiN film or an SiON film and wherein the second layer is an Si-based insulating film.

* * * * *